United States Patent
Vicinanza

(10) Patent No.: US 12,087,546 B2
(45) Date of Patent: Sep. 10, 2024

(54) VARIABLE INDUCTOR FOR PLASMA GENERATOR

(71) Applicant: Advanced Energy Industries, Inc., Fort Collins, CO (US)

(72) Inventor: Fabio Vicinanza, Sarzens (CH)

(73) Assignee: Advanced Energy Industries, Inc., Denver, CO (US)

( * ) Notice: Subject to any disclaimer, the term of this patent is extended or adjusted under 35 U.S.C. 154(b) by 388 days.

(21) Appl. No.: 17/365,081

(22) Filed: Jul. 1, 2021

(65) Prior Publication Data
US 2023/0005719 A1   Jan. 5, 2023

(51) Int. Cl.
*H02M 7/217* (2006.01)
*H01F 7/06* (2006.01)
(Continued)

(52) U.S. Cl.
CPC ........ *H01J 37/32174* (2013.01); *H01F 7/064* (2013.01); *H01F 21/08* (2013.01);
(Continued)

(58) Field of Classification Search
CPC .......... H01F 3/14; H01F 27/402; H01F 27/24; H01F 29/00; H01F 29/02; H01F 29/025; H01F 29/04; G01R 33/02; G01R 33/1215; H02M 5/40; H02M 5/42; H02M 5/453; H02M 7/7575; H02M 5/458; H02M 5/45;
(Continued)

(56) References Cited

U.S. PATENT DOCUMENTS 4,041,431 A * 8/1977 Enoksen ................. H01F 29/14
336/215
4,307,334 A * 12/1981 Peil ..................... H02M 3/3381
363/133
(Continued)

FOREIGN PATENT DOCUMENTS

EP        0778659 A2      6/1997

OTHER PUBLICATIONS

Extended European Search Report, Oct. 24, 2022, European Patent Office, Munich, Germany.
(Continued)

*Primary Examiner* — Thienvu V Tran
*Assistant Examiner* — Nusrat Quddus
(74) *Attorney, Agent, or Firm* — Neugeboren O'Dowd PC

(57) ABSTRACT

This disclosure describes systems, methods, and apparatus for waveform control, comprising: a power supply having an input terminal, and at least one output terminal for coupling to a load; a controller; a variable inductor coupled to at least one of the output terminals, the variable inductor comprising a first magnetic core having a plurality of arms, including at least a first inductor arm and a first control arm, wherein an inductance winding having one or more turns is wound around the first inductor arm, and wherein a first control winding comprising one or more turns is wound around the first control arm; and a DC current source coupled to the first control arm and the controller, the controller configured to adjust a DC bias applied by the DC current source to the first control arm to control an output waveform at the at least one output terminal.

15 Claims, 13 Drawing Sheets

(51) Int. Cl.
*H01F 21/08* (2006.01)
*H01J 37/32* (2006.01)

(52) U.S. Cl.
CPC .. *H01J 37/32027* (2013.01); *H01J 37/32045* (2013.01); *H01J 37/32146* (2013.01); *H01J 37/32183* (2013.01); *H02M 7/217* (2013.01); *H01J 2237/3321* (2013.01)

(58) Field of Classification Search
CPC .. H02M 5/4585; H02M 5/4505; H02M 5/451; H02M 5/452; H02M 5/447; H02M 5/456; H02M 1/12; H02M 1/4266; H02M 2001/123; H02M 3/073; H02M 3/10; H02M 3/135; H02M 3/137; H02M 3/28; H02M 3/315; H02M 3/3155; H02M 3/325; H02M 3/335; H02M 7/10; H02M 7/515; H02M 7/521; H02M 7/53; H02M 7/537; H02M 7/5383; H02M 7/538466; H02M 7/53862; H02M 7/5387; H02M 7/53871; H02M 7/53875; H02M 7/757; H02M 7/79; H02M 3/337; H02M 3/338; H02M 3/3382; H02M 3/3384; H02M 7/538; H02M 7/53806; H02M 7/53832; H02M 7/53835; H02M 7/487; H02M 7/539; H02M 7/23; H02M 7/217; H02M 7/21; H02M 7/12; H02M 7/04; H02M 7/00; H02H 7/261; H02H 7/268; H02H 7/055; H02J 3/36; H02J 3/01; H02J 3/1878; G05F 1/10; G05F 1/12; G05F 1/14; G05F 1/147; G05F 1/153; G05F 1/16; G05F 1/20; G05F 1/22; G05F 1/24; G05F 1/247; G05F 1/253; G05F 1/26; G05F 1/30; H01H 9/0005
See application file for complete search history.

(56) References Cited

U.S. PATENT DOCUMENTS

| | | | | |
|---|---|---|---|---|
| 4,994,952 A * | 2/1991 | Silva | ............... | H01F 29/14 174/DIG. 17 |
| 5,642,249 A * | 6/1997 | Kuznetsov | ......... | H02H 9/023 361/19 |
| 5,672,963 A * | 9/1997 | Corrigall | ............. | H01F 29/14 323/331 |
| 5,684,678 A * | 11/1997 | Barrett | ............. | H02M 3/3376 363/17 |
| 6,674,320 B2 * | 1/2004 | Duffy | ................. | H01F 29/14 336/155 |
| 7,274,574 B1 * | 9/2007 | Biegel | ............... | H05B 41/2827 363/21.16 |
| 8,120,457 B2 * | 2/2012 | Hu | ...................... | H01F 29/14 336/178 |
| 10,177,647 B2 * | 1/2019 | Wang | ................. | H02M 5/06 |
| 2005/0286270 A1 * | 12/2005 | Petkov | ............. | H02M 3/3376 363/17 |
| 2009/0231885 A1 | 9/2009 | Won | | |
| 2012/0243268 A1 * | 9/2012 | Kern | .................. | H01F 30/12 336/170 |
| 2015/0207433 A1 * | 7/2015 | Liu | .................... | H02M 7/5387 363/132 |
| 2016/0172982 A1 | 6/2016 | Yamaoka | | |
| 2017/0077799 A1 * | 3/2017 | Wang | ................. | H02M 7/217 |
| 2023/0421069 A1 * | 12/2023 | Perreault | ............. | H01F 27/38 |

OTHER PUBLICATIONS

Alonso et al., "Variable Inductor Modeling Revisited: the Analytical Approach", 2017, pp. 895-902, Publisher: IEEE, Published in: US.

Alonso et al., "Analysis and Experimentation of the Quad-U Variable Inductor for Power Electronics Applications", IET Power Electron, 2018, pp. 2330-2337, vol. 11, No. 14.

Bitencourt et al., "A Ferromagnetic Based Variable Inducgtor Analysis and Design Methodology", 2015, pp. 5, Publisher: IEEE.

Hu et al., "Single-Stage, Universal-Input AC/DC LED Driver With Current-Controlled Variable PFC Boost Inductor", IEEE Transactions on Power Electronics, Mar. 2012, pp. 1579-1588, vol. 27, No. 3.

Trumpf Huettinger, "Operating Instructions for Truplasma Bipolar 4030 G2.1 2X15KW PECVD Power Supply", Known to exist as early as Mar. 15, 2019, pp. 64, Publisher: TRUMPF Huettinger.

Perdigao et al., "A Review on Variable Inductors and Variable Transformers: Applications to Lighting Drivers", 2015, pp. 14, Publisher: IEEE, Published in: US.

Saeed et al., "Modeling of Variable Magnetic Elements Including Hysteresis and Eddy Current Losses", 2018 IEEE Applied Power Electronics Conference and Exposition (APEC), Mar. 2018, pp. 6.

* cited by examiner

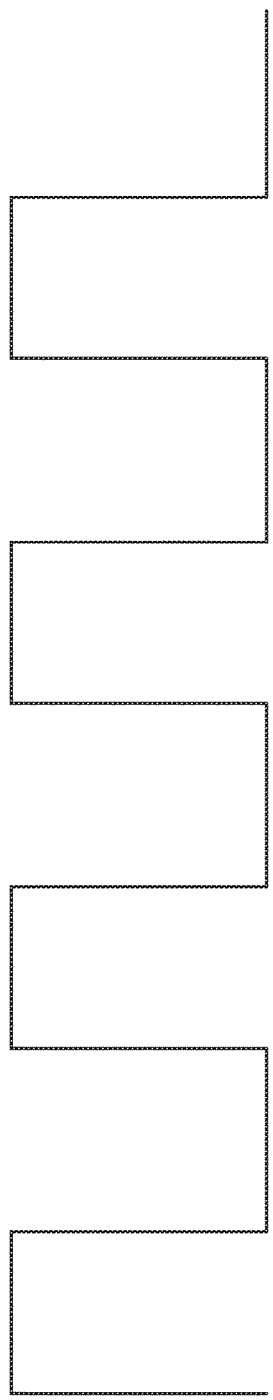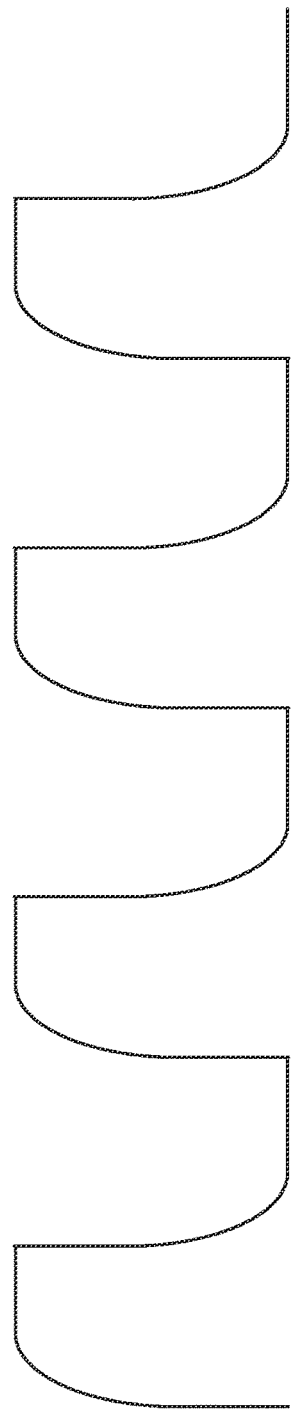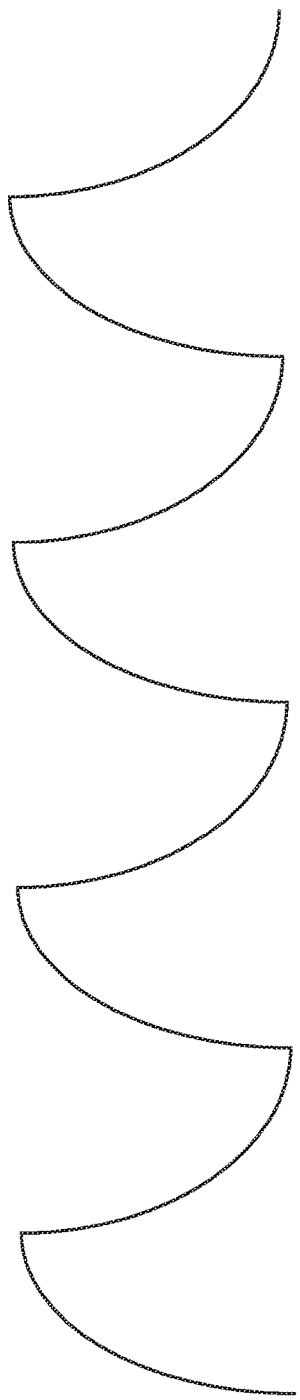

VARIABLE INDUCTOR FOR PLASMA GENERATOR

FIELD OF THE DISCLOSURE

This disclosure relates generally to variable inductor, and more particularly to systems, apparatuses, and methods for using one or more variable inductors to selectively apply power to a load.

DESCRIPTION OF RELATED ART

In plasma processing applications, such as the manufacture of semiconductors, solar panels, flat panel displays, Radio Frequency (RF) power generators operating over a wide range of frequencies may apply a voltage or current to an impedance load in a plasma chamber or otherwise. The impedance load can either be a plasma or a substrate within the chamber, and the chamber can be configured for plasma deposition of thin films on the substrate or for etching material from the substrate. In some cases, a matching network can be arranged between an RF power generator and the load and can be designed to provide an efficient transfer of power from the RF power generator to the plasma load in the chamber by matching the different impedances between the generator and the plasma load at the fundamental frequency of the RF power generator.

One form of plasma processing is called plasma enhanced chemical vapor deposition, or PECVD, and is widely used for solar panel fabrication. Manufacturers have long used sinusoidal waveforms to power the PECVD plasma load, but processes sometimes call for more power than a sinusoidal waveform can provide. Additionally, arcs can be difficult to detect with a sinusoidal waveform. As a result, some fabrication labs (also referred to as fabs) have turned to square wave generators that can achieve greater power delivery at the same voltage.

However, square waves have sharp edges that lead to harmonics that can influence thin film uniformity across a panel. For instance, some fabs use systems with many dozens or even hundreds of panels supported by elongated supports (e.g., 1.5 meters long), and a single power supply, meaning that the various electrodes in the chamber are all different electrical distances from the supply. Because of these different distances, slight differences in power are seen at the various electrodes and each panel may be influenced differently by the harmonics.

In some circumstances, power supply topologies produce load dependent waveforms. Thus, a supply that is intended to provide a square wave to a plasma load, may actually produce more of a triangular wave when the load impedance is low and more of a square wave when the load impedance is high. Several factors, including harmonics, waveform shape, consistency of waveform shape, etc., affect deposition uniformity. However, currently used techniques for reducing the harmonics and maintaining an output waveform are lacking. Thus, there is a need for a refined system for waveform control in power supply topologies.

SUMMARY OF THE DISCLOSURE

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

As described above, some power supplies produce load-dependent outputs. However, as the impedance of a load, such as a plasma load, changes, deposition uniformity may be impacted without adequate control of the output waveform shape, harmonics, etc. In some cases, a fixed inductor can be added to a power supply output to soften the edges of a wave (e.g., a square wave, an exponential wave, etc.) and reduce the harmonics, thereby improving deposition uniformity. However, even with the use of a fixed output inductor, the power supply produces a load dependent output waveform (e.g., an output waveform that is a function of L-R), thus limiting the possibilities and performances achievable from them. FIG. 1 illustrates one topology of a PECVD power supply using a single fixed inductor at the output to help smoothen the edges of a waveform output, such as a square waveform output, provided to the matching network and plasma load.

Another means to reduce harmonics is to use a trapezoidal pulse rather than a square wave. In these examples, the "top" of a pulse gradually rises from the rising edge toward the falling edge causing the leading edge transition to the "top" to be less severe and thus reducing harmonics compared to a pulse square wave. One known product producing such a trapezoidal pulse waveform is the TRUMPF HUETTINGER TruPlasma Bipolar 4000 power supply.

The following references are pertinent to understanding the disclosure and are hereby expressly incorporated by reference in their entirety:

[1] J. M. Alonso, M. Perdigão, M. A. Dalla Costa, S. Zhang and Y. Wang, "Variable inductor modeling revisited: The analytical approach," 2017 *IEEE Energy Conversion Congress and Exposition* (ECCE), 2017, pp. 895-902, doi: 10.1109/ECCE.2017.8095880.

[2] J. M. Alonso, M. Perdigão, M. A. Dalla Costa, S. Zhang and Y. Wang, "Analysis and experimentation of the quad-U variable inductor for power electronics applications," The Institution of Engineering and Technology.

[3] E. A. Bitencourt, M. R. Cosetin, I. G. Vegner and R. N. do Prado, "A ferromagnetic based variable inductor analysis and design methodology," 2015 *IEEE 13th Brazilian Power Electronics Conference and 1st Southern Power Electronics Conference* (COBEP/SPEC), 2015, pp. 1-5, doi: 10.1109/COBEP.2015.7420081.

Broadly, the disclosure relates to a system for waveform control comprising a power supply having an input terminal and at least one output terminal, a controller, and a variable inductor, where the variable inductor is configured to be coupled to the at least one output terminal of the power supply. In some cases, the inductance value or effective inductor of the variable inductor may be controlled using the controller and a DC current source. For instance, the controller may be configured to adjust a DC bias applied by the DC current source to the variable inductor, which may serve to control an output waveform at the at least one terminal of the power supply. In some cases, the power supply produces a load-dependent output. Some non-limiting examples of variable inductors that may be utilized include double E, triple E, or quad U variable inductors. Other topologies of variable inductors not described herein may be utilized in some embodiments.

Some embodiments of the disclosure may be characterized as a system for waveform control, comprising: a power supply having an input terminal and at least one output terminal, the at least one output terminal configured to be coupled to a load; a controller; a variable inductor configured to be coupled to one of the at least one output terminal of the power supply, the variable inductor comprising a first magnetic core, the first magnetic core comprising a plurality of arms, including at least a first inductor arm and a first control arm, wherein an inductance winding having one or more turns is wound around the first inductor arm, and wherein a first control winding comprising one or more turns is wound around the first control arm; and a direct current (DC) current source configured to be coupled to the first control arm and the controller, and wherein the controller is configured to adjust a DC bias applied by the DC current source to the first control arm to control an output waveform at the at least one output terminal of the power supply.

Other embodiments of the disclosure may be characterized as a power supply unit configured to maintain an output waveform, the power supply unit comprising: an input terminal and at least one output terminal, the at least one output terminal configured to be coupled to a variable load; an AC-DC converter configured to couple to the input terminal and convert an input analog current (AC) waveform to a DC waveform; a pulsed converter configured to convert the DC waveform from the AC-DC converter to a pulsed waveform; a controller; a variable inductor configured to be coupled between the pulsed converter and the at least one output terminal, wherein the variable inductor comprises: a first magnetic core, the first magnetic core comprising a plurality of arms, including at least a first inductor arm and a first control arm, wherein an inductance winding having one or more turns is wound around the first inductor arm, and wherein a first control winding comprising one or more turns is wound around the first control arm; a DC current source configured to be coupled to the first control arm and the controller, and wherein the controller is configured to adjust a DC bias applied by the DC current source to the first control arm to control an output waveform at the at least one output terminal.

Some other embodiments of the disclosure may be characterized as a method for maintaining an output waveform, comprising: providing a power supply unit, the power supply unit comprising an input terminal and at least one output terminal, wherein the power supply unit is configured to produce a load-dependent output; coupling a variable inductor to one of the at least one output terminal of the power supply unit; coupling a load having a variable impedance at the at least one output terminal; receiving one or more of voltage and current feedback from the at least one output terminal; and controlling an effective inductance of the variable inductor such that at least a shape of an output waveform at the at least one output terminal remains constant or substantially constant when an impedance of the load changes, wherein the controlling is based at least in part on the receiving.

In some embodiments of the system, the power supply unit, and/or the method, the power supply produces a load-dependent output.

In some embodiments of the system, the power supply unit, and/or the method, the variable inductor is a double E variable inductor comprising the first control arm and a second control arm, and wherein a second control winding comprising one or more turns is wound around the second control arm.

In some embodiments of the system, the power supply unit, and/or the method, the first inductor arm comprises two sections separated by an air gap.

In some embodiments of the system, the power supply unit, and/or the method, the inductance winding generates a first AC magnetic flux component in the first inductor arm that flows through the first inductor arm and splits into a second AC magnetic flux component that flows through one of the two control arms, and a third AC magnetic flux component that flows through the other of the two control arms.

In some embodiments of the system, the power supply unit, and/or the method, the DC bias generates a DC magnetic flux component in each of the two control arms, and wherein each of the DC magnetic flux components substantially circulate through the two control arms in the same direction, and wherein the second and third AC magnetic flux components are equal in magnitude and flow in opposite directions.

In some embodiments of the system, the power supply unit, and/or the method, the DC magnetic flux components flowing through the two controls arms bias the AC magnetic flux component flowing through the first inductor arm.

In some embodiments of the system, the power supply unit, and/or the method, the inductance winding is configured to receive a pulsed waveform, and wherein the DC magnetic flux components alter an inductance seen from the inductance winding.

In some embodiments of the system, the power supply unit, and/or the method, an effective inductance of the variable inductor is based at least in part on the DC bias.

In some embodiments of the system, the power supply unit, and/or the method, the controller is configured to control the DC bias and thereby a shape of the output waveform based on one or more of voltage and current feedback from the power supply.

In some embodiments of the system, the power supply unit, and/or the method, controlling the DC bias based on the current feedback comprises maintaining a constant or substantially constant relationship between a peak to peak current value and a measured time for waves of the output waveform, wherein the measured time is selected from a group consisting of a rising time, a falling time, and a timespan between a first and a second pre-defined current level.

In some embodiments of the system, the power supply unit, and/or the method, the at least one output terminal comprises two output terminals. In some embodiments, the controller is configured to receive first and second voltage measurements from a first and a second output terminal, respectively, of the two output terminals.

In some embodiments of the system, the power supply unit, and/or the method, controlling the DC bias based on the voltage feedback comprises maintaining a constant or substantially constant relationship between a peak to peak value and a measured time for voltage differential waves associated with the output waveform, wherein the voltage differential waves are based at least in part on the first and second voltage measurements, and wherein the measured time is selected from a group consisting of a rising time, a falling time, and a timespan between a first and a second pre-defined voltage differential level.

In some embodiments of the system, the power supply unit, and/or the method, the variable inductor is a triple E variable inductor. In some embodiments, the first magnetic core comprises an inductor core section having the first inductor arm and a control core section having the first control arm.

In some embodiments of the system, the power supply unit, and/or the method, the variable inductor is a quadruple U variable inductor, the quadruple U variable inductor further comprising: a second magnetic core having a second inductor arm, a second control arm, and another inductance winding having one or more turns wound around the second inductor arm; and wherein the first and the second magnetic core are separated by a spacer, and wherein the first control winding is wound around the spacer and the first and the second control arm.

In some embodiments of the power supply unit, the variable inductor is one of a double E, triple E, or quadruple U variable inductor. In some embodiments of the power supply unit, an effective inductance of the variable inductor is based at least in part on the DC bias. In some embodiments, the controller is configured to control the DC bias and thereby a shape of the output waveform when an impedance of the variable load changes based on one or more of voltage and current feedback from the at least one output terminal.

In some embodiments of the method, the variable inductor is one of a double E, triple E, or quadruple U variable inductor. Further, in some embodiments, the controlling comprises controlling a DC bias applied to at least one control arm of the variable inductor.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of 'a', 'an', and 'the' include plural referents unless the context clearly dictates otherwise.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

FIG. 3A illustrates an exemplary square waveform that might be produced by the power supply unit of FIG. 1.

FIG. 3B illustrates an exemplary exponential waveform that might be produced by the power supply unit of FIG. 2 using a variable inductor and a first DC bias, according to an embodiment of the disclosure.

FIG. 3C illustrates an exemplary exponential waveform that might be produced by the power supply unit of FIG. 2 using a variable inductor and a second DC bias, according to an alternate embodiment of the disclosure.

DETAILED DESCRIPTION

Figure 1:
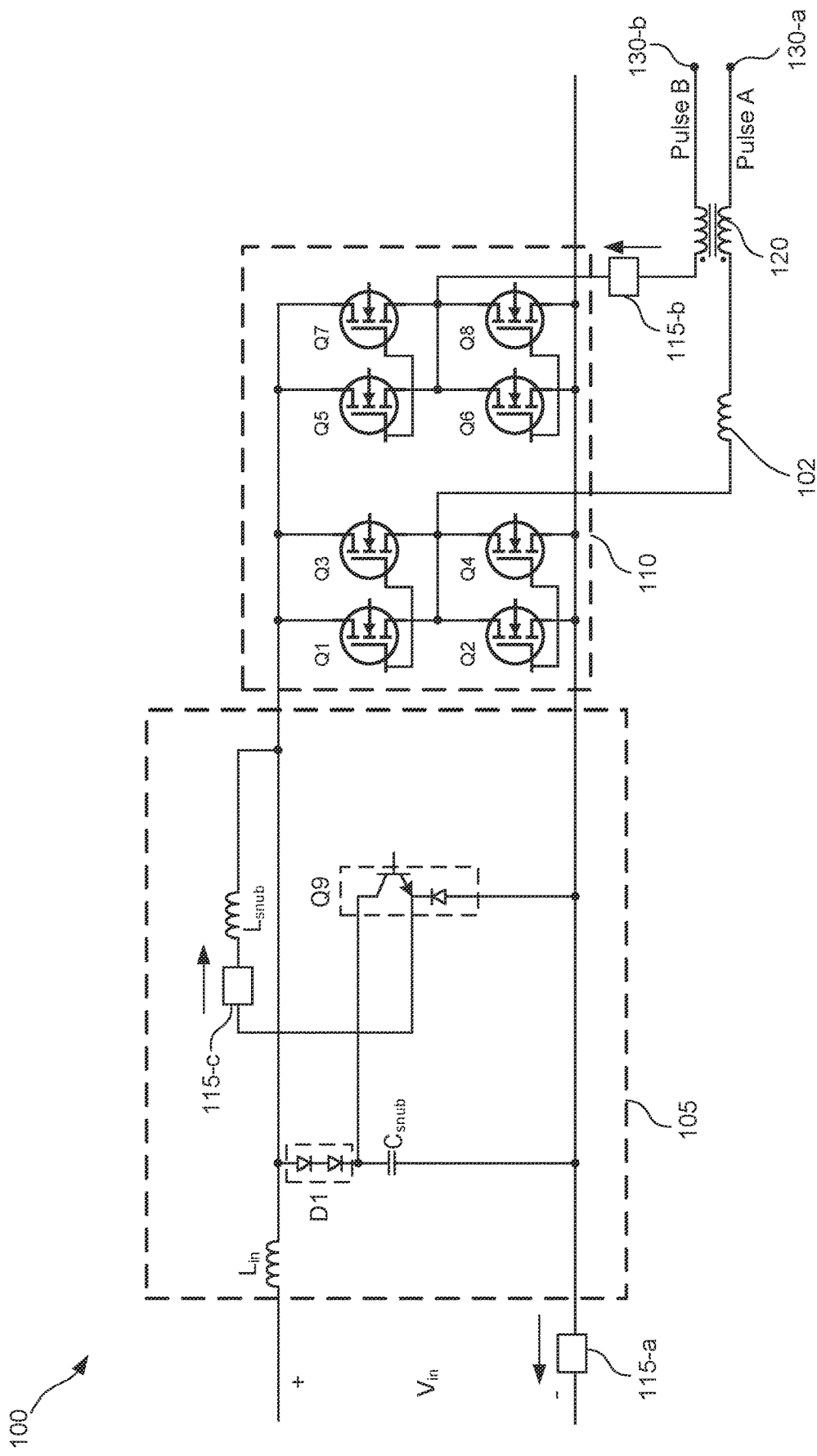
FIG. 1 illustrates one topology of a power supply using a single fixed inductor at the output.

The present disclosure relates generally to a system for waveform control. More specifically, but without limitation, the present disclosure relates to a power supply unit configured to maintain an output waveform through the use of a variable inductor.

Preliminary note: the flowcharts and block diagrams in the following Figures illustrate the architecture, functionality, and operation of possible implementations of systems, methods and computer program products according to various embodiments of the present disclosure. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

The word "exemplary" is used herein to mean "serving as an example, instance, or illustration." Any embodiment described herein as "exemplary" is not necessarily to be construed as preferred or advantageous over other embodiments.

As described above, some power supply topologies produce load-dependent outputs. In such cases, if the impedance of the load changes, one or more characteristics of the output waveform may also change. For instance, a shape of the output waveform, a rise time, a fall time, and/or a relationship between a peak to peak value and a measured time (e.g., rise time, fall time, timespan between a first and a second pre-defined voltage or current level, etc.) may also change, to name a few non-limiting examples. In some circumstances, an output waveform that is load dependent may adversely impact a plasma process, such as PECVD. Harmonics aside, a changing relationship between a peak to peak voltage (or current) value and a measured time (e.g., a product between the two) may also influence thin film uniformity across a panel. In some cases, plasma processes may be optimized by maintaining a constant or substantially constant relationship between a peak to peak voltage (or current) value and a measured time for output waves. In some cases, the relationship may relate to a product of the two (e.g., a product of the peak to peak voltage and a measured time for the output waves should be constant or substantially constant).

Resonant inverters are electrical inverters based on resonant current oscillation and comprise one or more resonant components (e.g., fixed inductors) and switching devices (e.g., MOSFETs, thyristors, etc.). Traditional resonant inverter topologies rely on adjustment of switching frequency to adjust one or more characteristics (e.g., a voltage) of an output waveform. In some cases, a fixed inductor in a resonant inverter topology may be replaced by a variable inductor, and the resonant inductance of the variable inductor may be controlled in lieu of the switching frequency. The resonant inductance of the variable inductor may be controlled by means of a DC current, although other types of control techniques are contemplated in different embodiments. In some cases, a variable inductor may facilitate the use of a constant or substantially constant switching frequency. Additionally or alternatively, a variable inductor may allow inherent isolated control, more linear control, constant electrode power, and enhanced efficiency, to name a few non-limiting examples. In another example, a variable inductor may enhance efficiency, Electromagnetic Interference (EMI), and/or SOA in resonant inverter topologies, further described below.

In some cases, the use of an inductor having a variable and a controllable inductance value may facilitate in optimizing behavior/performance of a plasma generator topology and/or expand existing functionalities. In one non-limiting example, a bipolar power supply producing a load-dependent output waveform may be utilized in a PECVD process and may have a fixed output inductor to smooth transitions. For instance, the output waveform may follow the behavior of an inductive-resistive (L-R) circuit, where the waveform may tend towards a triangular shape when the impedance or resistance decreases (i.e., as R becomes smaller) and a square shape when the impedance or resistance increases (i.e., as R becomes larger). In this example, by replacing the fixed output inductor with a variable inductor, the shape of the output waveform may be maintained (i.e., kept relatively constant) even with some load variation (e.g., changing R). In another example, a snubber circuit may be utilized between a DC-to-pulse section and an output filter (or alternatively, output terminals) of a power supply unit. In some cases, the snubber circuit may serve to suppress transients (e.g., voltage transients) at the output of the power supply unit. Additionally or alternatively, the snubber circuit may serve as a buffer and limit the rate of change of current (i.e., by serving as a $$\frac{di}{dt}$$

limiter), for instance, in the event of a short circuit (e.g., arcs) at the output. In some cases, for instance, while operating in high-voltage-high-frequency conditions, current may accumulate in the snubber circuit, which may trip a breaker or security to avoid saturation. In such cases, using a variable inductor may enable higher levels of saturation (e.g., by lowering variable inductance value) and offer extended usable standard/safe operating area (SOA) for the power supply. In some cases, the SOA refers to the voltage and/or current conditions over which a device (e.g., a power semiconductor device) may be expected to operate without self-damage. SOA combines one or more limitations of the device, such as, maximum voltage, current, power, junction temperature, and/or secondary breakdown into a single curve, which allows for a simplified design of protection circuitry. In some cases, SOA may be presented as a graph with $V_{CE}$ (collector-emitter voltage) on the x-axis and $I_{CE}$ (collector-emitter current) on the y-axis, where the SOA refers to the area under the curve.

Some power supply topologies produce load-dependent outputs. For example, when the impedance of a load changes, one or more of a shape and characteristics (e.g., smoothness of edges, rise time, fall time, etc.) of an output waveform may also change. Broadly, this disclosure describes systems, methods, and apparatuses using a variable inductor at an output of a power supply to maintain a shape and/or characteristics of a waveform when the power supply otherwise produces a load-dependent output. For instance, the variable inductor may allow an output waveform, such as an exponential waveform, or a square waveform having smooth edges, to be maintained despite a change in load impedance (e.g., impedance of a plasma load). It should be noted that, other types of waveforms (e.g., triangular waveform, sawtooth waveform) besides square and exponential waveforms may be controlled and their shapes maintained in alternative embodiments.

In some cases, variable inductors may be used in lieu of fixed output inductors for bias power supplies utilized in cathodic arc processes. In some cases, arc power supplies may be utilized for cathodic arc deposition. Such applications can have significant ripple on bias power supply output voltage, for instance, when combined with an arc supply on a system. This ripple is mainly due to the significant current variation requested to the bias power supply. The variable inductor may enable this ripple to be decreased as compared to a fixed output inductor.

In yet other cases, some arc power supplies utilize a non-linear inductor at their output terminals to smooth saturation. In some cases, these non-linear output inductors may comprise a custom air gap depending on the use case. Further, these non-linear inductors may be utilized to keep the arc ignited, especially at low current (i.e., since arcs have a higher propensity for extinguishing under low current conditions). In such cases, the non-linear inductor may be replaced by a variable inductor, which may not only add adjustability depending on current setpoint but also facilitate faster transitions for pulsed arc supplies.

In some cases, variable inductors may also serve to enhance a power factor (PF) of the passive front end of a power supply, for instance, under low power conditions. In some cases, the passive front end of a power supply is mainly composed of a three phases rectifier and a L-C filter. For given L-C values, the power factor is dependent on the power drawn from the main, with a higher power factor at higher power. Using a variable inductor for the L-C filter can allow higher inductance at low power, thereby increasing power factor.

In some cases, the fixed output inductor in a pulsing power supply unit (e.g., for single or dual-magnetron sputtering) may be replaced with a variable inductor, which may facilitate ignition at lower chamber pressures. In some cases, ignition in such power supplies may entail raising the voltage until a plasma is ignited. Further, once plasma ignition starts, the current in the plasma ramps up and voltage drops across the plasma (due to the plasma behavior and voltage drop across the inductor). However, if the voltage drop across the plasma exceeds a threshold, the plasma may extinguish (i.e., goes out). In such cases, adjusting the variable inductance value (e.g., decreasing the effective inductance of the VI after plasma ignition starts) may allow the plasma ignition to be maintained by ensuring the voltage drop across the plasma does not exceed the threshold.

FIG. 1 illustrates a power supply unit 100 using a single fixed output inductor 102. In some cases, the power supply unit 100 may further comprise an AC-DC converter (not shown) coupled across the input terminals ($V_{in}$ denotes the output voltage from the AC-DC converter or some other DC source), a snubber circuit 105, a DC-pulsed circuit 110, one or more current sensors 115 (e.g., current sensor 115-a, current sensor 115-b, current sensor 115-c), and an optional output filter 120 at output terminals 130 (e.g., output terminal 130-a, output terminal 130-b) of the power supply unit 100. In some cases, the power supply unit 100 may comprise two output terminals 130-a and 130-b, where Pulse A and Pulse B denote the waveforms at the respective output terminals. Although not required, usually, the output voltage provided by the power supply unit 100 may comprise a differential output voltage (e.g., Pulse A voltage-Pulse B voltage). As shown, the snubber circuit 105 may comprise one or more inductors ($L_{in}$, $L_{snub}$), an optional current sensor 115-c, a switch or diode ($D_1$), a capacitor ($C_{snub}$), and a switch ($Q_9$). In some cases, the switch ($Q_9$) may be a bipolar junction transistor (BJT), although another type of switch, such as a Metal Oxide Semiconductor Field Effect Transistor (MOSFET) or Junction Gate Field Effect Transistor (JFET) may be utilized in some embodiments. In some cases, the snubber circuit 105 may comprise one or more additional components not shown herein. Further, the DC-pulse section 110 may be configured to be coupled between the snubber circuit 110 and the output terminals 130, for instance, between the snubber circuit 110 and the fixed output inductor 102. As illustrated, the DC-pulse section 110 may comprise one or more switches (e.g., $Q_1$-$Q_8$) arranged in a bridge configuration (e.g., two or more half- or full-bridges). In some cases, the one or more switches ($Q_1$-$Q_8$) may be implemented using MOSFETs, such as p-type or n-type MOSFETs, although other types of switches are contemplated in different embodiments. Further, it should be noted that the switches $Q_1$-$Q_8$ need not be identical. For instance, in one non-limiting example, switch $Q_1$ may be implemented using a MOSFET, while switch $Q_2$ may be implemented using a BJT.

The power supply unit 100 illustrates one example topology of a PECVD power supply using a single fixed inductor (i.e., inductor 102) at the output. The inductor 102 may help smoothen the edges of a waveform output (e.g., an exponential waveform, a square waveform) at the output terminals 130. As noted above, the waveform output produced by the power supply unit may refer to a differential output waveform derived from the output terminals (e.g., Pulse A voltage-Pulse B voltage). In some cases, the output terminals 130 may be coupled to a load, such as a plasma load. Further, a matching network (not shown) may be provided between the output terminals 130 and the plasma load to optimize power transfer efficiency to the plasma load.

Figure 2:
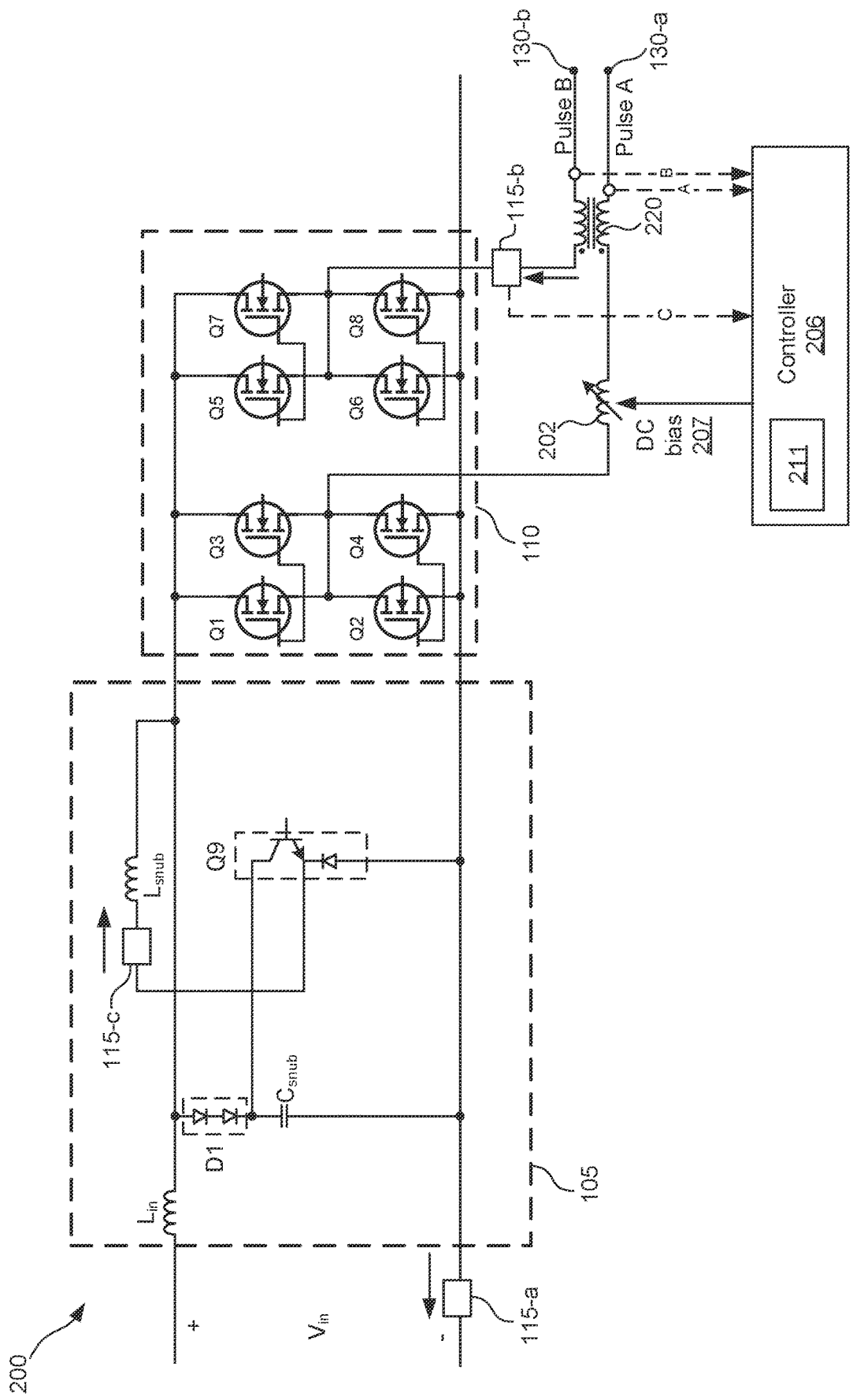
FIG. 2 illustrates a power supply unit configured to maintain an output waveform through a variable inductor at the output, according to an embodiment of the disclosure.

FIG. 2 illustrates a power supply unit 200 configured to maintain an output waveform (e.g., an exponential wave, a square wave, etc.) through a variable inductor 202 at the output, according to an embodiment of the disclosure. In some cases, the output waveform may comprise a differential output voltage waveform (e.g., between output terminal 130-a and output terminal 130-b, or vice-versa). In some cases, the power supply unit 200 may implement one or more aspects of the power supply unit 100, previously described in relation to FIG. 1. For instance, the power supply unit 200 may comprise an AC-DC converter (not shown) coupled across the input terminals, where $V_{in}$ denotes the output voltage from the AC-DC converter, a snubber circuit 105, a DC-pulse section 110, and an optional filter 220 (e.g., a common mode choke, an inductor, etc.). In some cases, the variable inductor 202 may be used in lieu of a fixed output inductor (e.g., inductor 102 in FIG. 1). As shown, the variable inductor 202 may be configured to be coupled at one end to the DC-pulse section 110 and at another end to at least one output terminal (e.g., output terminal 130-a) of the power supply 200. In some cases, an effective inductance of the variable inductor 202 may be controllable using a controller 206 and/or a DC bias (e.g., a DC current source). For instance, the controller 206 may be configured to control a DC bias 207 applied by a DC current source 211 to the variable inductor 202, further described in relation to the figures below. In some cases, the variable inductor 202 may influence both rising and falling edges of the output pulses (e.g., Pulse A at output terminal 130-a, Pulse B at output terminal 130-b). Additionally or alternatively, the variable inductor 202 may influence both rising and falling edges of the differential output voltage waveform, the differential output voltage waveform derived by subtracting Pulse A and Pulse B voltages, or vice-versa. Further, the controller 206 may be configured to receive one or more measurements, such as a current measurement from the current sensor 115-b, a first voltage measurement (A) from a first one of the output terminals (e.g., output terminal 130-a), and a second voltage measurement (B) from a second one of the output terminals (e.g., output terminal 130-b). The controller 206 may determine the DC bias 207 for application based at least in part on the one or more current and/or voltage measurements (e.g., differential output voltage, A-B). Further, the controller 206 may instruct the DC current source 211 to apply the DC bias 207, where the DC bias 207 may be applied to a control arm or winding of the variable inductor 202. While FIG. 2 illustrates the DC current source 211 as being within the controller 206, in other embodiments, the DC current source may be separate from the controller 206 and in electronic communication with the controller 206. It should be noted that, the variable inductor 202 and/or the current sensor 115-b may be coupled to either of the output terminals of the power supply unit 200, and the arrangement in FIG. 2 is not intended to be limiting. In some cases, the optional output filter 220 may also be referred to as a common mode choke and may comprise at least one inductor. The common mode choke may be configured to minimize or reduce transients (e.g., voltage transients) at the output terminals 130.

In the example shown, the switches ($Q_1$-$Q_8$) of the DC-pulse section 110 are arranged in one or more full bridge configurations, where a first full bridge comprises switches $Q_1$-$Q_4$ and a second full bridge comprises switches $Q_5$-$Q_8$. It should be noted that the DC-pulse section 110 configuration illustrated in FIG. 2 is not intended to be limiting, and other applicable topologies (e.g., one or more half-bridge pairs of switches) may be utilized in different embodiments.

FIG. 3A illustrates an exemplary square waveform 300-a that might be produced by the power supply unit with a fixed inductor, such as the power supply unit 100 with the fixed output inductor 102 previously described in relation to FIG. 1. FIG. 3B illustrates an exemplary exponential waveform 300-b that might be produced by a power supply with a variable inductor and a first DC bias, such as the power supply unit 200 with the variable inductor 202 previously described in relation to FIG. 2. FIG. 3C illustrates an exemplary exponential waveform 300-c that might be produced by a power supply with a variable inductor and a second DC bias, such as the power supply unit 200 with the variable inductor 202 previously described in relation to FIG. 2. In some cases, the first and second DC biases applied to the variable inductor (e.g., variable inductor 202) may be different. In some cases, exponential waveforms 300-b and/or 300-c may be easier to maintain than a square waveform (e.g., square waveform 300-a), since a smaller variation in inductance may allow the exponential waveform shape to be maintained. Said another way, larger inductance variations may be needed to maintain a square waveform, as opposed to an exponential waveform, when the load impedance changes.

In some cases, a power supply unit with an output inductor (e.g., a fixed or variable inductor) may produce one of the waveforms 300-b or 300-c when a static or fixed load is coupled to the output terminal(s). In other words, either one of a fixed or a variable inductor may achieve the beveling of the corners of the pulses seen in waveforms 300-b and/or 300-c. However, when the impedance of a load, such as a plasma load, changes, a fixed output inductor may cause the waveform shape to swing (e.g., between waveform 300-b and 300-c). According to aspects of this disclosure, the shape of a waveform (e.g., waveform 300-b) may be maintained (i.e., in spite of variations in the load impedance) through the use of a variable, rather than a fixed, inductor at the output. For instance, when the impedance of a load changes, the effective inductance of the variable inductor may be adjusted so that the shape of waveform 300-b may be maintained. As noted above, the effective inductance of the variable inductor may be controlled using a controller and a DC current source. In one non-limiting example, the controller may determine a DC bias to be applied to the variable inductor to adjust the effective inductance of the variable inductor. Further, the controller may instruct the DC current source to apply the DC bias to the variable inductor, for instance, to a control winding of the variable inductor.

In some cases, adjusting the inductance of the variable inductor may also allow one or more characteristics of the output waveform to be maintained, for instance, a relationship (e.g., a product) between a peak-to-peak current value and a measured time for waves or pulses of the output waveform. Some non-limiting examples of the measured time include a rising time, a falling time, and a timespan between a first and a second pre-defined current level. In other cases, one or more voltage specific characteristics of the output waveform may be maintained, for instance, a relationship between a peak-to-peak value and a measured time for voltage differential waves associated with the output waveform, where the voltage differential waves are based at least in part on first and second voltage measurements (e.g., first voltage measurement is associated with Pulse A, second voltage measurement is associated with Pulse B in FIG. 2). In this example, the measured time may be selected from a group consisting of a rising time, a falling time, and a timespan between a first and a second pre-defined voltage differential level.

Figure 4A:
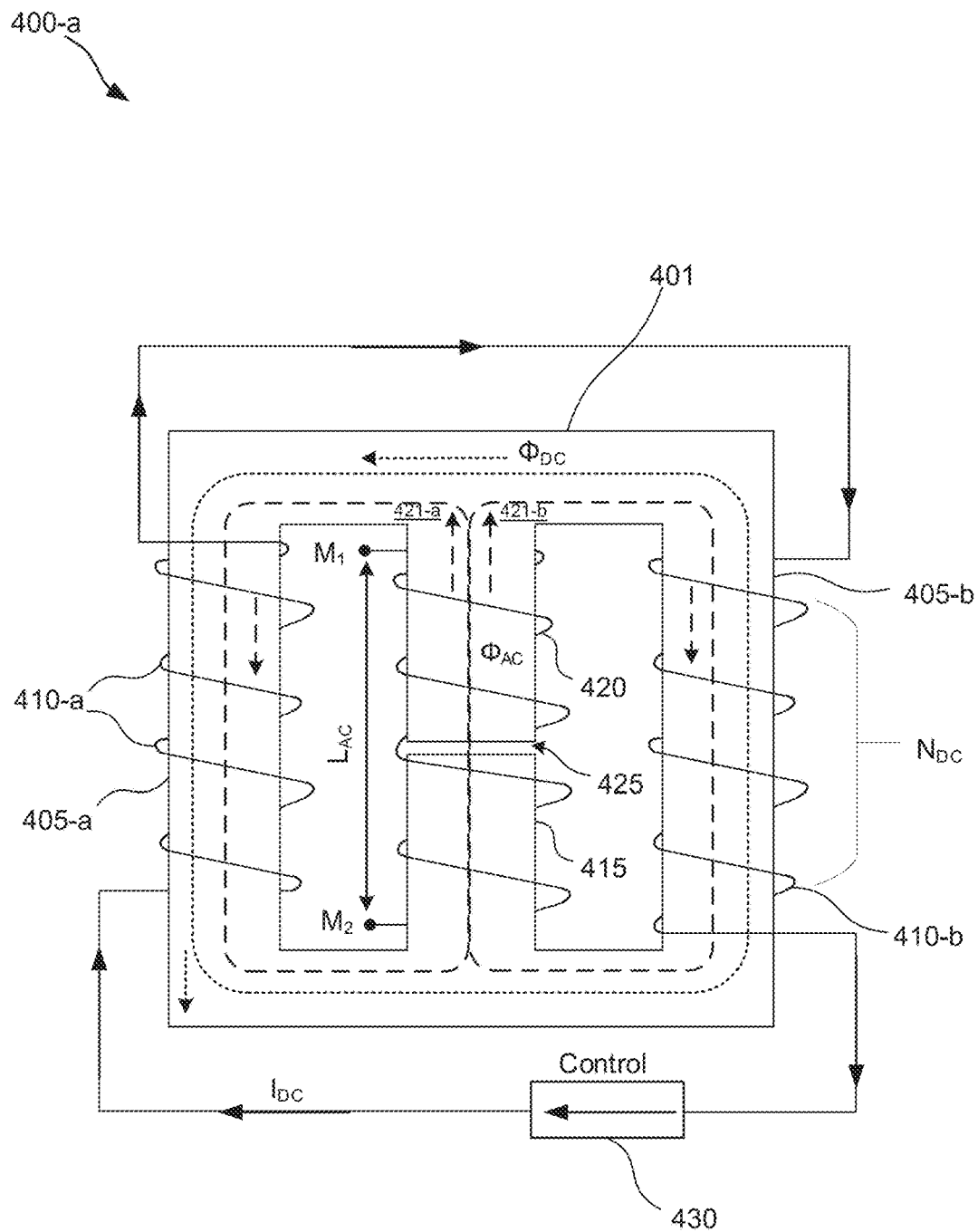
FIG. 4A illustrates one example of a variable inductor configured to be coupled at an output terminal of a power supply unit, according to an embodiment of the disclosure.
Figure 4B:
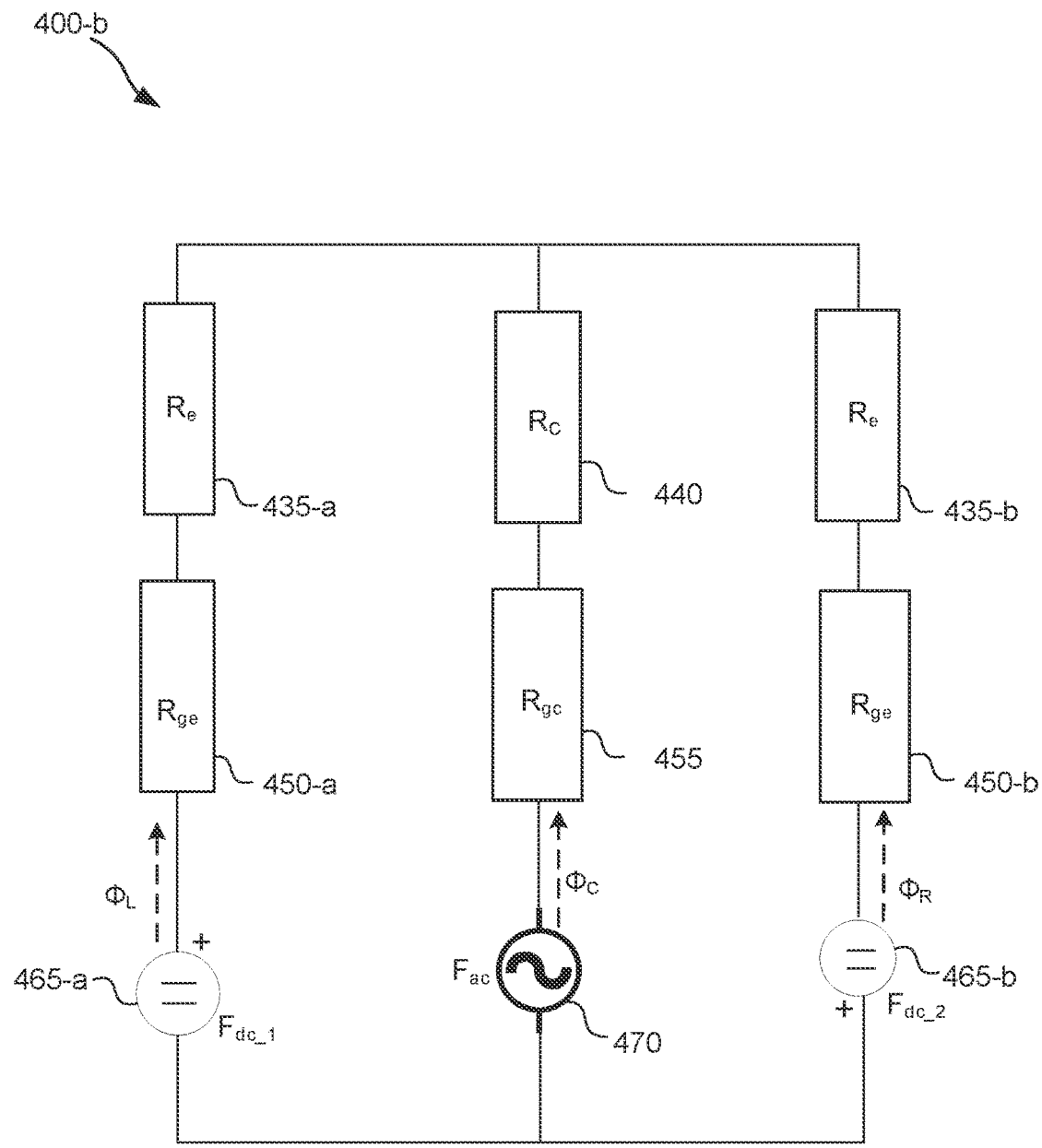
FIG. 4B illustrates an equivalent reluctance circuit for the variable inductor of FIG. 4A, according to an embodiment of the disclosure.

FIG. 4A illustrates a variable inductor 400-a having a double E ("EE") structure. Further, FIG. 4B illustrates an equivalent reluctance circuit 400-b of the variable inductor 400-a in FIG. 4A. In some cases, the variable inductor 400-a may be similar or substantially similar to, and may be implemented as, the variable inductor 202 previously described in relation to FIG. 2.

In some cases, variable inductors (VIs) may be controlled by means of a DC current level (i.e., a DC bias). Usually, in a VI, a DC magnetic flux is injected into the structure in order to provide a bias level that allows for magnetic permeability modulation. In some cases, the AC magnetic flux amplitude is a degree or more smaller than the bias level. Under this assumption, it may be possible to analyze the VI 400-a by applying the superposition principle to the equivalent reluctance circuit 400-b. In some cases, the AC magnetic flux may be superposed to this DC level, thus making it possible that a variable inductance can be seen from the AC windings. Various VI structures can be implemented, though the double E structure, the triple E structure, and the quadruple U structure are the most common.

As shown, the variable inductor 400-a comprises a magnetic core 401, where the magnetic core 401 comprises one or more arms, including an inductor arm 415 (also referred to as central arm 415) and two control arms 405-a and 405-b. In some cases, an inductance winding 420 having one or more turns (represented as $N_{ac}$) may be wound around the inductor arm 415. The inductor arm 415 may comprise an air gap 425, which may serve to limit the maximum amplitude of the AC magnetic flux density. In some cases, the inductance winding 420 may be configured to receive a pulsed waveform (e.g., a square waveform, an exponential waveform, such as exponential waveform 300-b in FIG. 3B) from a DC-pulsed section (e.g., DC-pulse section 110 in FIG. 2) of a power supply unit.

Further, a first control winding 410-a having one or more turns (represented as $N_{dc}$) may be wound around the first control arm 405-a and a second control winding having one or more turns may be wound around the second control arm 405-b. In some cases, the number of turns ($N_{dc}$) wound around the first and the second control arms 405 may be the same to maintain symmetry in the structure. As illustrated, first ends of the control windings 410 may be coupled or joined together to form a loop around the upper perimeter of the magnetic core 401. Further, a second end of the second control winding 410-b may be coupled to a first end of the DC current source 430, while the second end of the DC current source may be coupled to the second end of the first control winding 410-a. In some cases, the DC current source 430 may be configured to inject a DC current ($I_{dc}$) into the control windings 410, thus changing one or more of the DC flux density (e.g., driving the DC flux density towards the knee of the material B-H curve), the permeability (e.g., decreasing permeability), and the reluctance (e.g., increasing reluctance) in the VI 400-a. In this way, the effective inductance ($L_{AC}$) of the variable inductor 400-a measured between terminals $M_1$ and $M_2$ may be controlled. In some cases, one of the terminals (e.g., $M_1$) may be coupled to a DC-pulse section of the power supply unit, while the other of the terminals (e.g., $M_2$) may be coupled to an output terminal (e.g., output terminal 130-a in FIG. 2) of the power supply unit.

For sake of simplicity, it is assumed that the main winding or inductance winding 420 only produces an AC magnetic flux (e.g., $\phi_{AC}$) with no DC component, while the control or auxiliary windings 410 only handle a DC current. This DC current generates a DC magnetic flux component (e.g., $\phi_{DC}$) which is used to bias the AC magnetic flux component flowing through the inductor arm. For instance, the inductance winding 420 generates an AC magnetic flux component ($\phi_{AC}$) in the inductor arm 415 that flows through the inductor arm and splits into first and second AC magnetic flux components 421-a and 421-b that flow through the first and second control arms 405, respectively. Since the number of turns 410 around the first and second control arms 405 are equal, the first and second AC magnetic flux components 421-a and 421-b are also equal in magnitude. As seen, the first and second AC magnetic flux components flow in opposite directions through the first and second control arms, respectively, and effectively cancel each other. The DC bias applied by the DC current source 430 generates a DC magnetic flux component (not shown) in each of the two control arms, where each of the DC magnetic flux components substantially circulate through the two controls arms 405 in the same direction. In this way, a DC magnetic flux component (e.g., $\phi_{DC}$) that is the sum of the individual DC magnetic flux components flowing through each of the control arms 405 circulates within the outer perimeter of the magnetic core 401, while an AC magnetic flux component ($\phi_{AC}$) flows through the inductor arm 415. This DC magnetic flux component biases the AC magnetic flux component and alters an inductance seen from the inductance winding 420, for instance, an inductance $L_{AC}$ between the first end or terminal ($M_1$) and a second end or terminal ($M_2$) of the inductance winding 420.

In some embodiments, the DC current source 430 comprises a controller or is in electronic communication with a controller (e.g., shown as controller 206 in FIG. 2). The controller may be configured to control the DC bias applied by the DC current source to alter the VI inductance. Additionally or alternatively, the controller may be configured to control the DC bias and thereby a shape of the output waveform (e.g., shown as exponential waveform 300-b in FIG. 3B) based on one or more of voltage and current feedback from output terminals of a power supply, previously described in relation to FIGS. 2 and 3.

Turning now to FIG. 4B, which illustrates an equivalent reluctance circuit 400-b for the double E variable inductor 400-a previously described in relation to FIG. 4A. As seen, $R_c$ 440, $R_e$ 435-a and 435-b, $R_{gc}$ 455, and $R_{ge}$ 450-a and 450-b represent the reluctances of the inductor or central arm (e.g., inductor arm 415), control or outer arms (e.g., control arms 405), inductor arm air gap (e.g., airgap 425), and outer arm air gaps, respectively. While not shown in FIG. 4A, in some cases, each of the outer and control arms may comprise an airgap. In general, the use of airgaps in the outer/control arms is avoided since it increases the DC field intensity needed to control the effective inductance of the VI. However, manufacturing processes may lead to small airgaps (i.e., small as compared to the inductor arm airgap) in the control arms. The equivalent reluctance circuit 400-b models such intentional and unintentional airgaps in the inductor and control arms, respectively.

The equivalent reluctances $R_c$ 440, $R_e$ 435-a and 435-b, $R_{gc}$ 455, and $R_{ge}$ 450-a and 450-b may be modeled based on one or more dimensions of the VI structure, such as lengths and/or cross-sectional areas. For instance, the lengths $l_c$, $l_e$, $l_{gc}$, $l_{ge}$ represent the lengths of the central/inductor arm, outer/control arms, inductor arm airgap, and control/outer arms airgaps, respectively, and $A_c$ and $A_e$ represent the cross-sectional areas of the central and outer arms, respectively. In some cases, the equivalent reluctances may also be based on the material permeability ($\mu(B)$) as a function of the magnetic flux density, the permeability of free space $\mu_0$, and one or more fringing factors, where $v_c$ and $v_e$ represent the fringing factors for the central arm airgap and outer arm airgap, respectively.

The reluctance $R_c$ 440 can be computed as:

$$R_c = \frac{l_c}{\mu(B)A_c} \qquad \text{(Equation 1)}$$

The reluctance $R_e$ 435 can be computed as:

$$R_e = \frac{l_e}{\mu(B)A_e} \qquad \text{(Equation 2)}$$

The reluctance $R_{ge}$ 450 can be computed as:

$$R_{ge} = \frac{l_{ge}}{\mu_0 v_e A_e} \qquad \text{(Equation 3)}$$

The reluctance $R_{gc}$ 455 can be computed as:

$$R_{gc} = \frac{l_{gc}}{\mu_0 v_c A_c} \qquad \text{(Equation 4)}$$

FIG. 4B also depicts the magneto-motive forces (MMF) created by the inductor and control windings, which are shown as $F_{ac}$ 470 and $F_{dc}$ 465-a and $F_{dc}$ 465-b, respectively. $\Phi_L$, $\Phi_C$, and $\Phi_R$ represent the magnetic fluxes through the left (i.e., control arm 405-a), central (i.e., inductor arm 415), and right (i.e., control arm 405-b) arms, respectively. While not shown, a DC equivalent reluctance circuit of the double E VI may be obtained by removing the $F_{ac}$ 470 from the central arm. Similarly, an AC equivalent reluctance circuit of the double E VI may be obtained by removing the $F_{dc}$ 465-a and $F_{dc}$ 465-b from the left and right outer arms. By analyzing the AC equivalent reluctance circuit and/or applying the superposition principle to the AC and DC equivalent reluctance circuits, the inductance of the main winding may be obtained, further described below.

In the double E structure, the inductor winding (also referred to as primary or main winding) is wrapped around the central arm of the structure, with a number of turns defined by $N_{ac}$. The auxiliary windings are wrapped around the outer arms, with a number of turns equal to $N_{dc}$ each. The auxiliary windings carry a DC current, which generates a DC flux in the outer arms used to bias the core magnetic flux and thereby alter an inductance seen from the primary winding. The magnetic flux in the core may have an AC component and a DC component, and by changing the DC current through the auxiliary (or control) windings, the DC flux density in the core can be driven toward the knee of the material B-H curve, decreasing permeability and increasing reluctance. In this way, the effective inductance of the structure, $L_{ac}$, can be controlled. The effective inductance of the double E variable inductor as a function of DC bias current in the auxiliary windings is:

$$L_{ac} = \frac{N_{ac}\phi_{c\_ac}}{I_{ac}} \quad \text{(Equation 5)}$$

In Equation 5, $I_{ac}$ represents the AC current flowing through the central winding and $\Phi_{c\_ac}$ represents the AC magnetic flux component flowing through the central arm. The AC magnetic flux component ($\Phi_{c\_ac}$) is a function of one or more of the DC magnetic flux components flowing through the control/outer arms and the DC bias current.

In the example above, the AC component is assumed to be much smaller than the DC level. Further, as noted above, an airgap is often placed in the central arm to limit the maximum amplitude of the AC flux density. An airgap in the outer arms may be counterproductive as it will lead to a need for greater DC current to achieve the same DC flux, thus increasing losses in the auxiliary windings and decreasing efficiency. However, some very small lateral airgap in the outer arms may be unavoidable due to manufacturing processes.

Figure 5A:
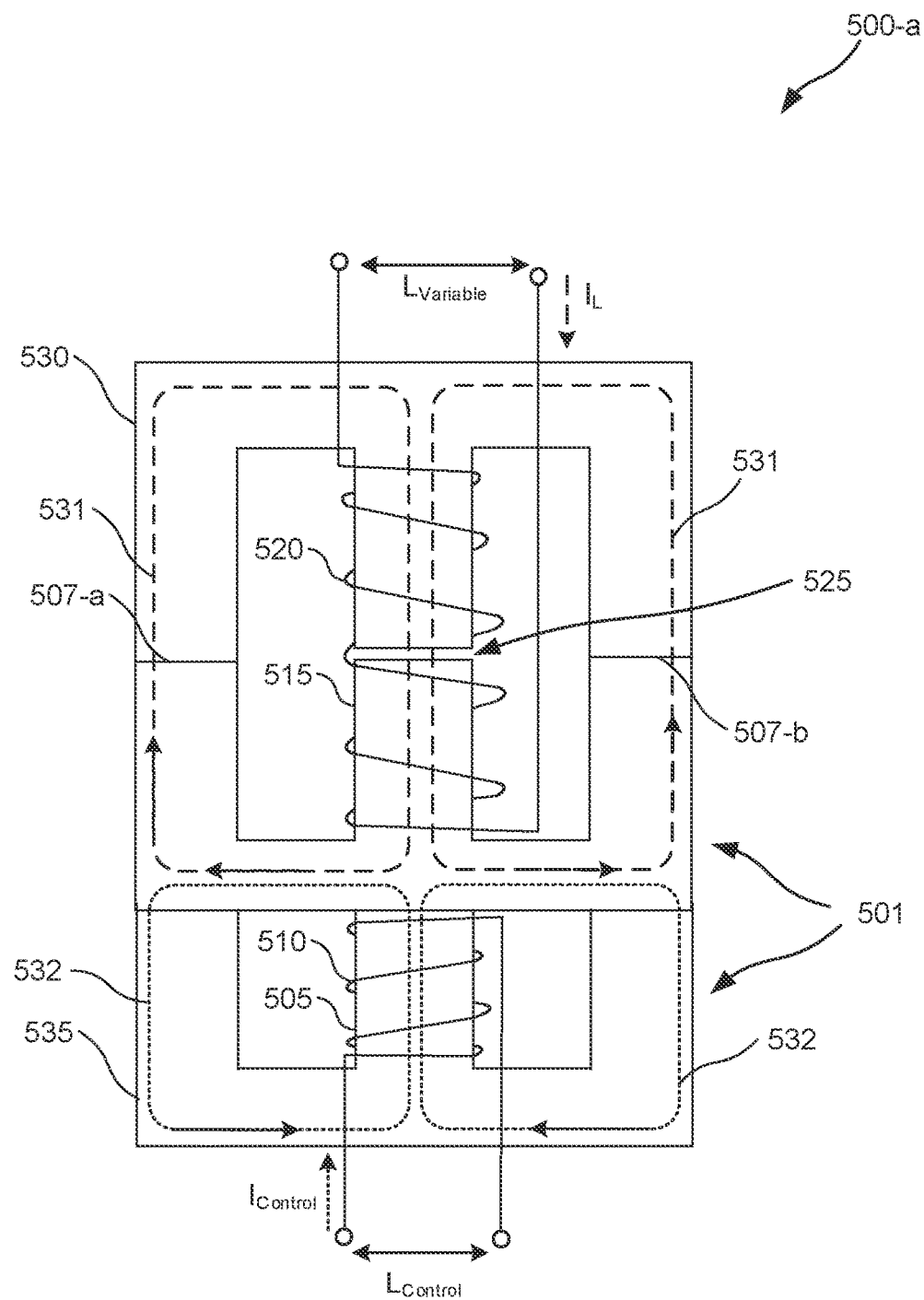
FIG. 5A illustrates another example of a variable inductor configured to be coupled at an output terminal of a power supply unit, according to an embodiment of the disclosure.

FIG. 5A illustrates a variable inductor 500-$a$ having a triple E ("EEE") structure. In some examples, the variable inductor 500-$a$ may be an example of the VI 202 previously described in relation to FIG. 2. As shown, the variable inductor 500-$a$ may comprise a magnetic core 501, where the magnetic core may be split into an inductor section 530 and a core section 535. In some cases, the inductor and core sections may be formed as separate pieces, and one of the sections (e.g., inductor section 530) may be stacked on top of the other section (e.g., control section 535). Each of the inductor and core sections may comprise a plurality of arms. For instance, the inductor section 530 comprises a central or inductor arm 515 and an inductor winding 520 having one or more turns wound around the inductor arm 515. In some cases, the number of turns of the inductor winding may be represented as $N_L$. In some embodiments, the inductor arm 515 may comprise an airgap 525. Further, the inductor section 530 may comprise one or more optional airgaps 507-$a$ and 507-$b$ in its outer arms.

Further, the control section 535 may have one or more arms, including a control arm 505. A control winding 510 having one or more turns may be wound around the control arm 505, where the number of turns may be represented as $N_{Control}$. In some embodiments, a DC current ($I_{Control}$) may be injected into one end of the control winding 510, for instance, using a DC current source (not shown). The DC current source may be similar or substantially similar to the one previously described in relation to FIG. 2 and may be in communication with a controller. The controller may determine the DC current to be applied, for instance, to maintain a shape or one or more characteristics of an output waveform.

An AC magnetic flux 531 ($\Phi_L$) circulating in the inductor section 530 of the magnetic core may be affected by a DC magnetic flux 532 ($\Phi_{Control}$) circulating in the control section 535, wherein the DC magnetic flux may depend on the DC current ($I_{Control}$) injected into the control winding 510. Further, the $L_{variable}$ inductance value may be represented as follows:

$$L_{variable} = N_L \times \frac{\phi_L}{i_L} \quad \text{(Equation 6)}$$

$$\text{where } \phi_L = \frac{N_L \times I_L}{R_{eq}(I_{Control})} \quad \text{(Equation 7)}$$

Figure 5C:
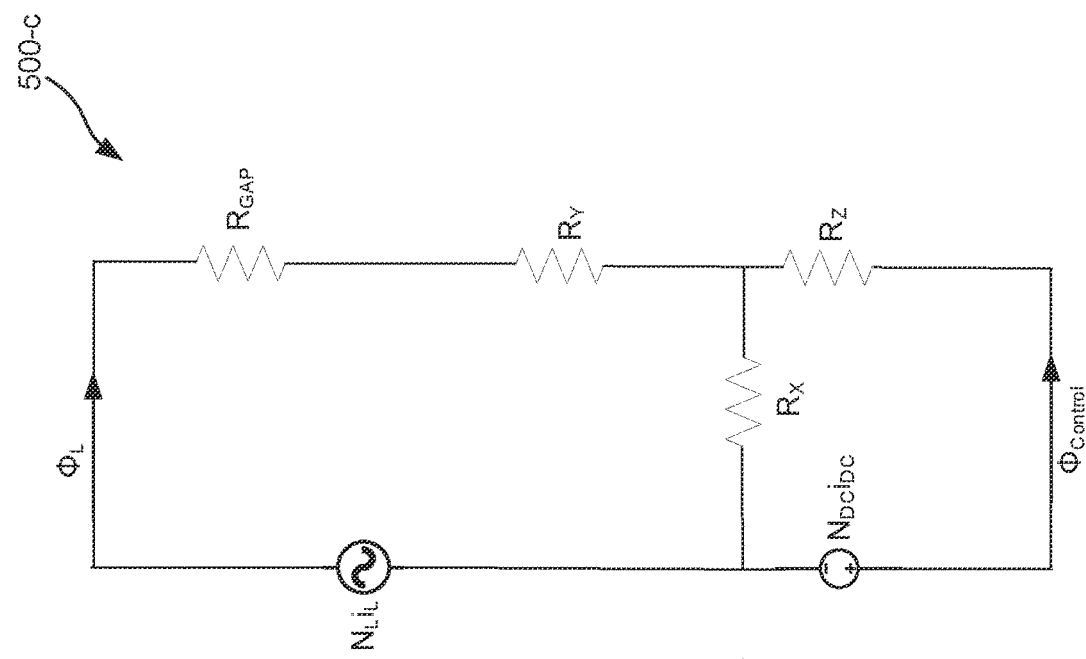
FIG. 5C illustrates a simplified model of the equivalent reluctance circuit 500-*b*.
Figure 5B:
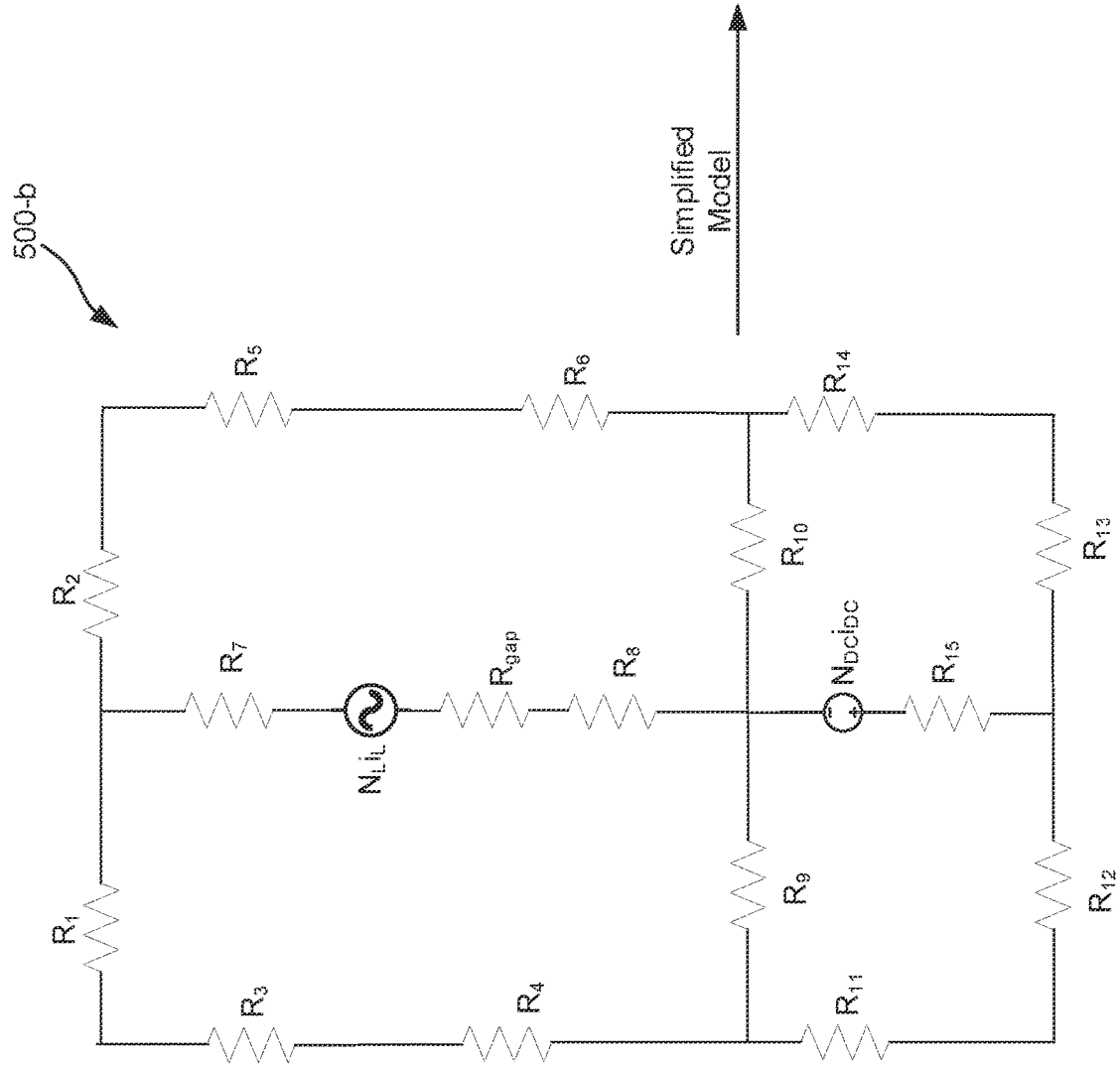
FIG. 5B illustrates an equivalent reluctance circuit for the variable inductor of FIG. 5A, according to an embodiment of the disclosure.
Figure 5D:
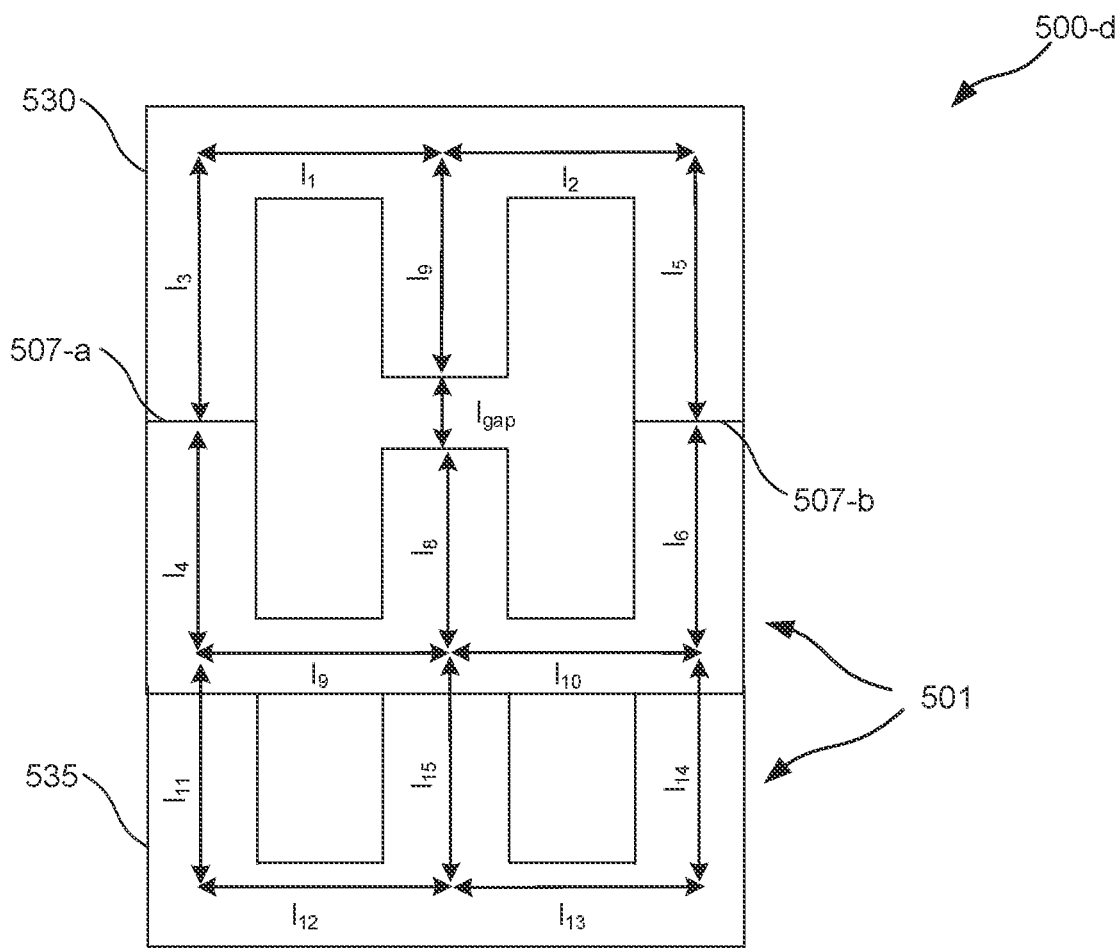
FIG. 5D illustrates relevant dimensions of the VI 500-*a* that will be used to derive the effective inductance of the triple E VI as a function of the DC bias current in the control or auxiliary windings.

Turning now to FIG. 5B which illustrates an equivalent reluctance circuit 500-$b$ for the triple E variable inductor 500-$a$ of FIG. 5A. Further, equivalent reluctance circuit 500-$c$ in FIG. 5C illustrates a simplified model of the equivalent reluctance circuit 500-$b$. FIG. 5D illustrates relevant dimensions of the VI 500-$a$ that will be used to derive the effective inductance of the triple E VI as a function of the DC bias current in the control or auxiliary windings. As shown, the equivalent reluctance circuit 500-$b$ comprises a plurality of reluctances (e.g., $R_i$ where i ranges from 1 through 15 as seen in FIGS. 5B and 5D), a DC voltage source ($N_{control}I_{control}$), and an AC voltage source ($N_L I_L$), where each of the voltage sources represents a magnetomotive force (MMF). In some cases, each of the reluctances may be a function of a magnetic field circuit length (i.e., for a section of an i path in the magnetic core 501 in FIG. 5D, such as $l_1$, $l_2$, $l_3$, $l_{11}$, $l_{12}$, etc.), the permeability of free space ($\mu_0$), a corresponding section area ($A_i$) where there is magnetic flux in the i path, and a magnetic material differential permeability ($\mu_{diff}$). The magnetic material differential permeability may be obtained from the derivation of the B×H curve divided by the magnetic permeability constant ($\mu_0$). Thus, each of the reluctances $R_i$ may be represented as follows:

$$R_i = \frac{l_i}{\mu_0 \mu_{diff} A_i} \quad \text{(Equation 8)}$$

Further, the series and parallel equivalent reluctances $R_x$, $R_y$, $R_z$ in FIG. 5C may be obtained as follows:

$$R_y = 5\frac{l}{\mu_0 \mu_{diff} A} \quad \text{(Equation 9)}$$

$$R_x = \frac{l}{\mu_0 \mu_{diff} A} \quad \text{(Equation 10)}$$

$$R_z = 3\frac{l}{\mu_0 \mu_{diff} A} \quad \text{(Equation 11)}$$

Further, the gap reluctance ($R_{GAP}$) may be computed as follows:

$$R_{GAP} = 2\frac{l_{gap}}{\mu_0 A} \quad \text{(Equation 12)}$$

Using equations 9-12, an equivalent reluctance seen by the source $N_L I_L$ as a function of the control DC current ($I_{cntrl}$) may be obtained as follows:

$$R_{eq} = (I_{cntrl}) = \frac{R_z(I_{cntrl}).R_x(I_{cntrl})}{R_z(I_{cntrl}) + R_x(I_{cntrl})} + R_y + R_{GAP} \quad \text{(Equation 13)}$$

Finally, by combining equations (6), (7) and (13), the effective inductance of the triple E variable inductor as a function of DC bias current in the control (or auxiliary) windings is:

$$L_{ac} = \frac{N_L^2}{R_{eq}(I_{cntrl})} \quad \text{(Equation 14)}$$

Figure 6A:
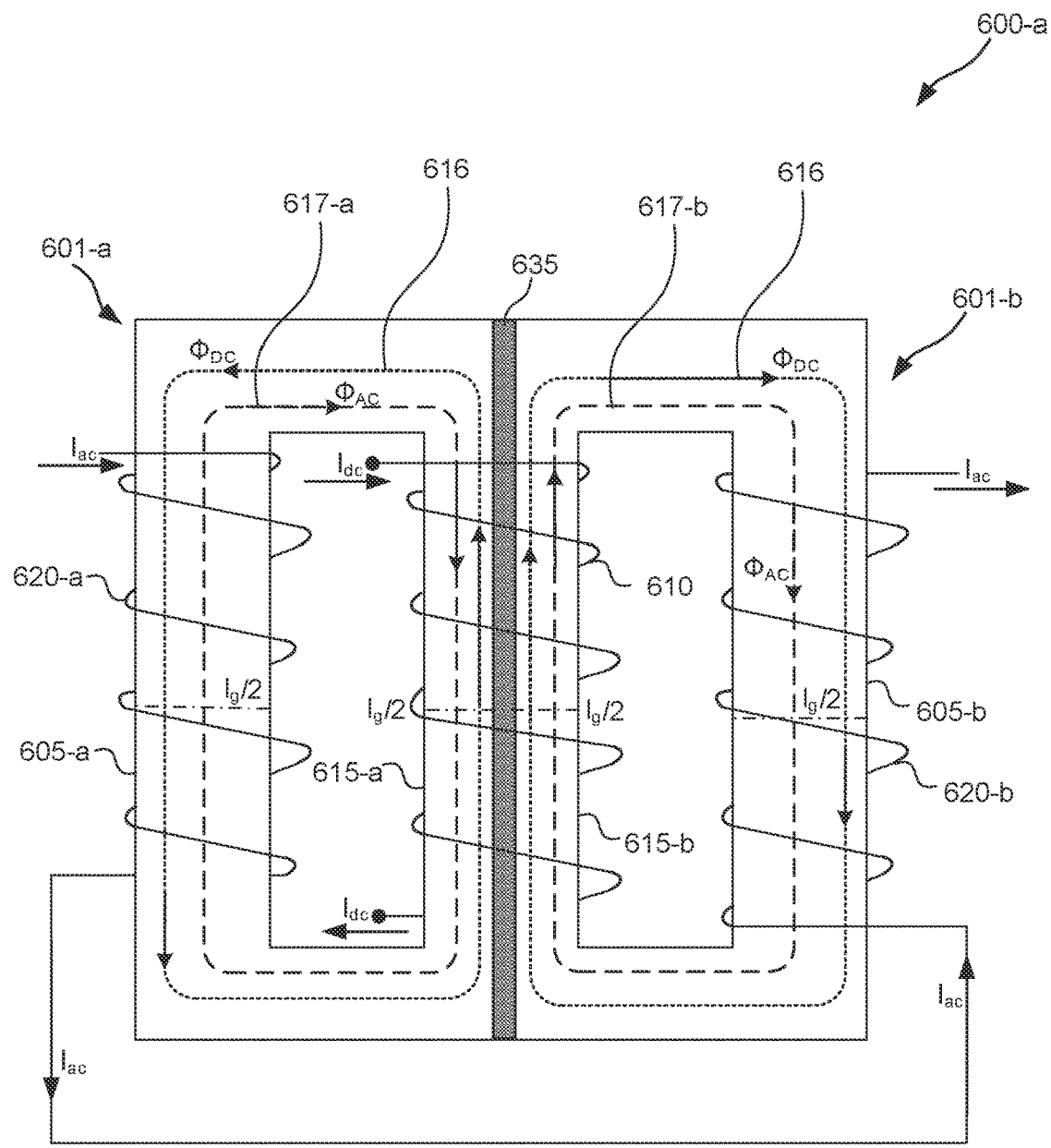
FIG. 6A illustrates another example of a variable inductor configured to be coupled at an output terminal of a power supply unit, according to an embodiment of the disclosure.

FIG. 6A illustrates a variable inductor 600-a having a quadruple U structure (also referred to as quad U). The variable inductor 600-a may be used as the variable inductor 202, previously described in relation to FIG. 2. As seen, the variable inductor 600-a comprises two magnetic cores 601-a and 601-b separated by a spacer 635. Each magnetic core 601 comprises two arms, including an inductor arm 605 (e.g., inductor arm 605-a, inductor arm 605-b) and a control arm (e.g., control arm 615-a, control arm 615-b). In the example shown, the spacer 635 is positioned between the control arms 615 of the two magnetic cores 601. In some cases, an inductor winding 620 (e.g., inductor winding 620-a, inductor 620-b) having one or more turns, represented as $N_{ac}$, may be wound around each of the inductor arms 605. Further, a control winding 610 having one or more turns, represented as $N_{dc}$, may be wound around the control arms 615 and the spacer 635. In some cases, the control winding 610 may be coupled to a DC current source, where the DC current source is configured to inject or apply a DC current ($I_{dc}$) to the control winding. The DC current source may be coupled to or in communication with a controller (shown as controller 206 in FIG. 2). The controller may be configured to receive one or more current measurements and/or voltage measurements from one or more output terminals of a power supply unit, where the power supply unit produces a load-dependent output. In some examples, the variable inductor 600-a may behave in a similar manner to one or more of the variable inductor 400-a and variable inductor 500-a previously described in relation to FIGS. 4A and 5A, respectively. For instance, the control winding (also referred to as a DC bias winding) wound embracing both control arms 615 may generate a circulating DC magnetic flux 616 ($\Phi_{dc}$) inside each magnetic core 601. Further, the inductor winding (also referred to as an AC winding) may generate an AC magnetic flux 617 ($\Phi_{ac}$) that circulates through each magnetic core 601. The AC or inductor windings 620-a and 620-b may be connected such that the AC magnetic flux 617-a in magnetic core 601-a circulates in an opposite direction to the AC magnetic flux 617-b in magnetic core 601-b when the AC magnetic fluxes 617 go through the control or DC winding 610. Such an arrangement may serve to prevent excessive AC voltage to be reflected across the control winding 610.

In some aspects, a quad-U variable inductor structure may allow for a higher degree of symmetry from the point of view of the AC and DC magnetic flux paths, as compared to the double-E and triple-E structures. For instance, the DC magnetic flux may circulate through the entire structure of the quad-U VI, which may allow a designer to get a further reduction of the effective inductance for the same VI volume. In other words, a quad-U structure may allow for a larger inductance range for the same size and/or DC bias current range, as compared to the double-E and triple-E variable inductor structures.

Similar to the variable inductors 400-a and 500-a described in relation to FIGS. 4A and 5A, it is assumed that the inductor winding 620 only produces an AC magnetic flux 617, with no DC component. Further, the control or auxiliary winding 610 handles a DC current ($I_{dc}$), which generates the DC magnetic flux component 616 used to bias the AC magnetic flux 617. While not shown, in some embodiments, an air gap may be placed in each magnetic core 601, for instance in the inductor arms 605-a and 605-b. The air gap may serve to limit the maximum value of the AC magnetic flux, which may decrease magnetic losses (i.e., as compared to when no air gap is present) and minimize the likelihood of saturation due to the AC magnetic flux 617. It should be noted that, while an air gap under a threshold (e.g., 0.12 mm, 0.15 mm, 0.20 mm, etc.) may serve to enhance the performance of the VI 600-a, a large gap may have the negative effect of requiring more DC bias current to achieve the same DC magnetic flux, which not only increases the losses in the DC bias circuit, but also adversely impacts the efficiency of the VI structure. In some cases, the DC magnetic flux 616 circulating through the magnetic cores may be used to modulate the permeability of the magnetic material according to its B-H curve, for instance, from the linear region up to saturation. This change in permeability may effect a change of reluctance and/or a variation of the AC inductance of the VI 600-a.

Figure 6B:
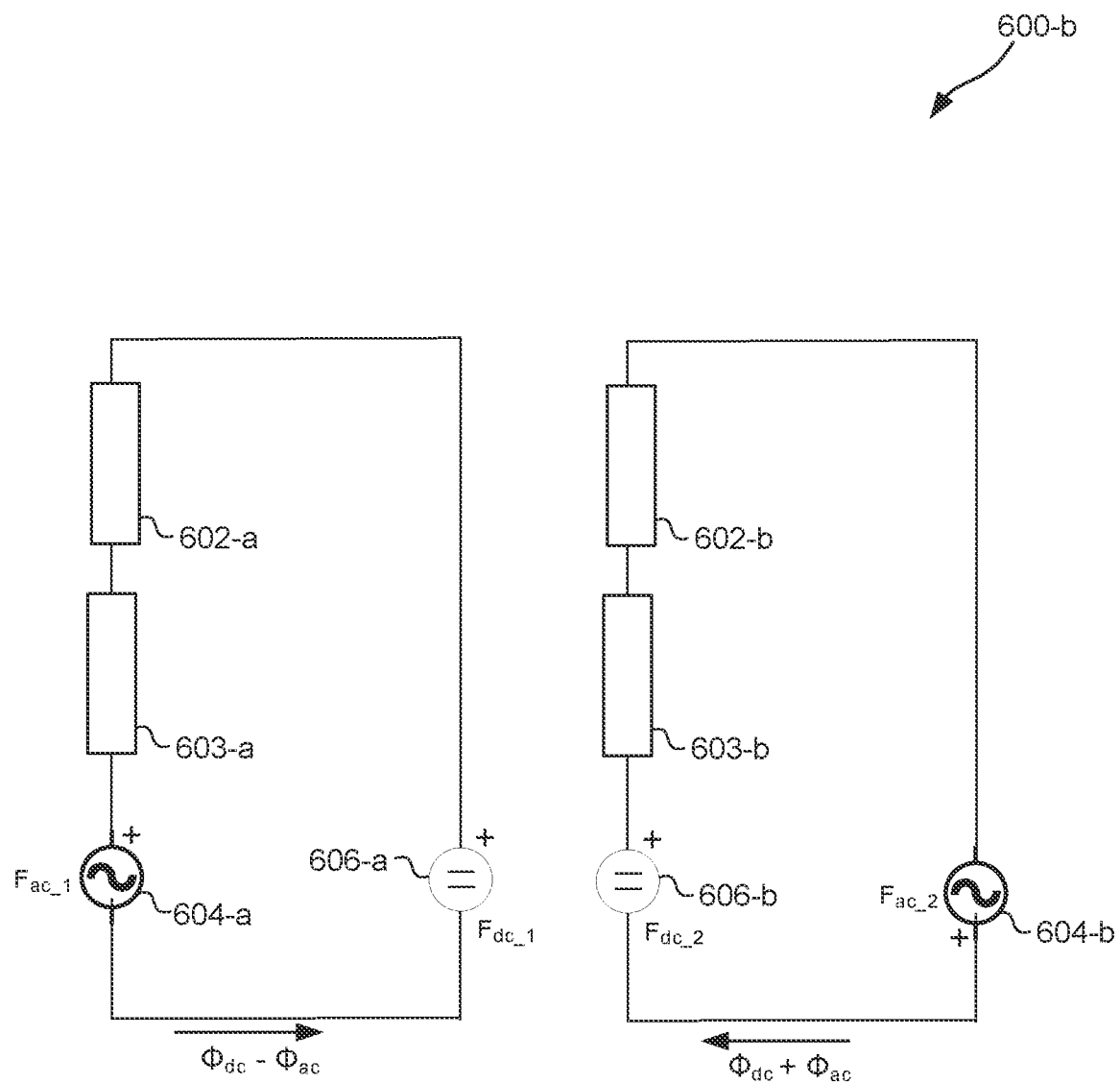
FIG. 6B illustrates an equivalent reluctance circuit for the variable inductor of FIG. 6A, according to an embodiment of the disclosure.

FIG. 6B illustrates an equivalent reluctance circuit 600-b for the quadruple U variable inductor 600-a of FIG. 6a. As seen, the equivalent reluctance circuit 600-b depicts equivalent reluctances 602-a and 603-a of a first one of the magnetic core (e.g., magnetic core 601-a) and its respective airgap, and equivalent reluctances 602-b and 603-b of a second one of the magnetic core and its respective airgap. Further, DC voltage sources ($F_{dc\_1}$) 606-a and ($F_{dc\_2}$) 606-b represent the MMF created by the DC or control winding (e.g., control winding 610 in FIG. 6A) in each magnetic core (e.g., magnetic core 601-a, 601-b in FIG. 6A), while AC voltage sources ($F_{ac\_1}$) 604-a and ($F_{ac\_2}$) 604-b represent the MMF created by the inductor or AC windings (e.g., inductor winding 620-a, inductor 620-b) in each magnetic core. The MMF for each of the $F_{ac}$ and $F_{dc}$ voltage sources may be calculated as $N_{ac}I_{ac}$ and $N_{dc}I_{dc}$, respectively.

In some cases, $\Phi_{dc}$ and $\Phi_{ac}$ represent the DC and AC magnetic fluxes, respectively, inside each of the magnetic cores. The AC magnetic flux component may be at least one order of magnitude smaller than the DC magnetic flux component, which may facilitate in reducing magnetic losses in the magnetic cores. Under this assumption, the AC magnetic flux components can be considered as a small-signal operation. Thus, it may be possible to analyze the behavior of the quad-U VI structure by superposing the DC and AC magnetic flux components. By calculating the DC operating point, information related to the AC winding inductance (e.g., effective inductance of the VI), AC magnetic flux density, and/or magnetic losses may also be obtained. In some examples, Equation (18) may be used to compute the AC inductance of the quad-U variable inductor:

$$L_{ac} = \frac{2N_{ac}\phi_{ac}}{I_{ac}} \quad \text{(Equation 15)}$$

In some cases, the AC magnetic flux ($\emptyset_{ac}$) in Equation 15 is a function of the DC magnetic flux density ($B_{dc}$) and may be calculated as follows:

$$\phi_{ac}(B_{dc}) = \frac{N_{ac}I_{ac}}{r_e(B_{dc}) + r_g} \quad \text{(Equation 16)}$$

In Equation 16, $r_e$ and $r_g$ represent the AC arm and gap reluctances of each magnetic core, which are calculated using Equations 17 and 18, as follows:

$$r_e = \frac{l_e}{\mu_d(B_{dc})A_e} \quad \text{(Equation 17)}$$

In Equation 17, $\mu_d$ represents the differential permeability given by $$\frac{dB}{dH},$$

where B denotes the magnetic field density and H denotes the magnetic field intensity.

$$r_g = \frac{l_g}{\mu_0 v_g A_e} \quad \text{(Equation 18)}$$

Further, the DC magnetic flux density ($B_{dc}$) may be calculated using Equation 19, while $\emptyset_{dc}$ may be calculated using Equation 20.

$$B_{dc} = \frac{\emptyset_{dc}}{A_e} \quad \text{(Equation 19)}$$

$$\emptyset_{dc} = \frac{F_{dc}}{R_e + R_g} \quad \text{(Equation 20)}$$

In Equation 20, $R_e$ and $R_g$ represent the reluctances used to calculate the DC operating point and are shown in FIG. 6B as 602 and 603, respectively.

$$R_e = \frac{l_e}{\mu(B)A_e} \text{ and } R_g = \frac{l_g}{\mu_0 v_g A_e},$$

where $l_e$ and $l_g$ are the lengths of the magnetic paths (e.g., length of $\emptyset_{dc}$ loop in FIG. 6A) and airgaps, respectively. Further, $A_e$ represents the cross-sectional area of the 'U' portion of the magnetic cores, for instance, the 'U' portion above or below the airgap. Lastly, $v_g$ represents the fringing factor for the airgap.

Further, by simplifying Equations 16-20, the AC inductance of each AC or inductor winding as a function of the DC bias current and/or the DC magnetic flux density can be calculated as follows:

$$\frac{L_{ac}}{2} = \frac{N_{ac}\emptyset_{ac}}{I_{ac}} \quad \text{(Equation 21)}$$

Finally, Equation 15 representing the total AC inductance (i.e., variable inductance) of the VI structure as a function of the DC bias current can now be obtained from Equation 21.

It should be noted that the VI topologies described in relation to FIGS. 4-6 are not intended to be limiting, and different VI structures are contemplated in different embodiments. In some cases, any one of VIs 400-a, 500-a, and 600-a may be used as the VI 202 in FIG. 2. In some cases, a first end of the AC or inductor winding of the VIs in FIGS. 4-6 may be coupled to a DC-pulse section (e.g., shown as DC-pulse section 110 in FIG. 2), while a second end of the AC or inductor winding may be coupled to one of the output terminals (e.g., output terminal 130-a associated with Pulse A). Alternatively, the second end of the AC or inductor winding may be coupled to one end of the optional filter 220, while the other end of the optional filter 220 may be coupled to one of the output terminals. In one non-limiting example, the first end of the inductor winding of the VI may be coupled to a center of a full-bridge configuration of switches (e.g., between switches $Q_1$ and $Q_2$, between $Q_3$ and $Q_4$, or both) of the DC-pulse section 110 in FIG. 2. Further, the DC or control winding of the VI (e.g., VI 400-a) may be coupled to the DC current source 211 and/or the controller 206. In such cases, the effective inductance of the VI may be based at least in part on the applied DC bias (e.g., $I_{DC}$). In some examples, the controller 206 may be configured to the control the DC bias and thereby a shape of the output waveform based on one or more of voltage and current feedback from the power supply. For instance, FIG. 2 illustrates current feedback C received from the current sensor 115-b, and voltage feedback A and B corresponding to the output pulses (i.e., Pulse A and Pulse B) seen at the output terminals 130-a and 130-b, respectively.

Figure 7:
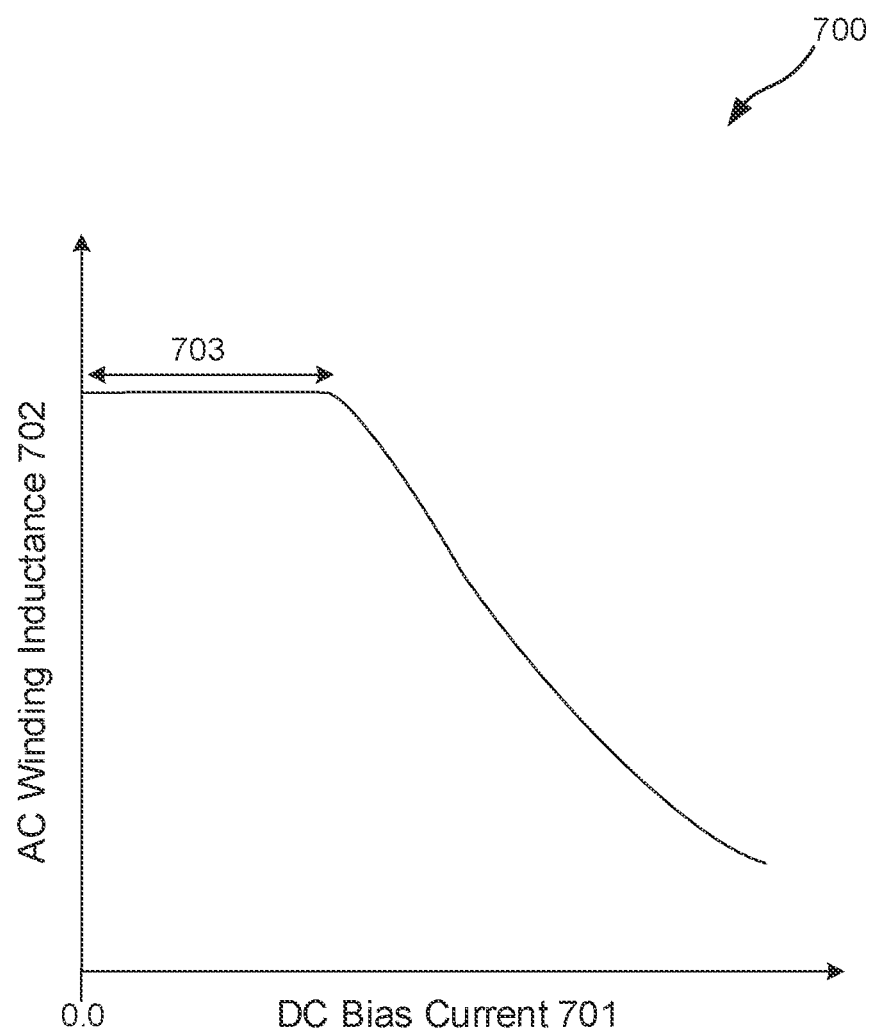
FIG. 7 illustrates an example plot for an effective inductance of a variable inductor as a function of a DC bias current, in accordance with one or more implementations.

FIG. 7 illustrates an example of a plot 700 showing a relation between a DC bias current 701 and an AC winding inductance 702 for a variable inductor (e.g., VI 202, VI 400-a, VI 500-a, etc.). The AC winding inductance 702 may represent the effective inductance of the variable inductor. As seen, in some circumstances, the AC winding inductance 702 remains relatively constant across a range 703 of applied DC bias current 701, after which it starts tapering off. It should be noted that the relation between the DC bias current 701 and the AC winding inductance 702 depicted in FIG. 7 is merely an example, and not intended to be limiting.

Figure 8:
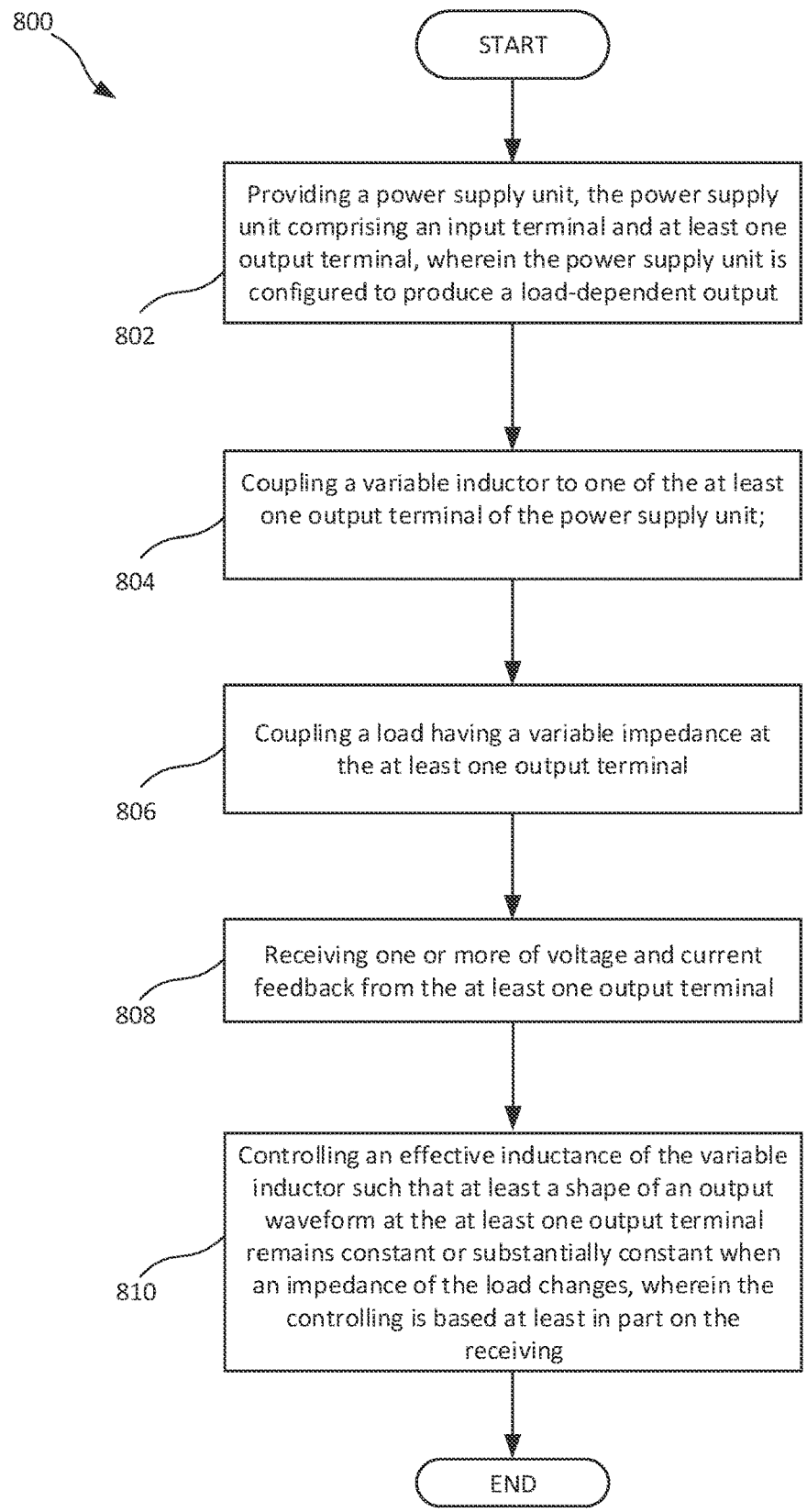
FIG. 8 illustrates a flowchart of a method for maintaining an output waveform, according to an embodiment of the disclosure.

FIG. 8 illustrates a flowchart of a method 800 for maintaining an output waveform, according to an embodiment of the disclosure. In some examples, method 800 may implement one or more aspects of the power supply unit 200 and/or variable inductors 400-a, 500-a, 600-a, previously described in relation to FIGS. 2 and 4-6.

At step 802, the method 800 comprises providing a power supply unit, where the power supply unit comprises an input terminal and at least one output terminal. In some examples, the power supply unit is configured to produce a load-dependent output.

At step 804, the method comprises coupling a variable inductor (e.g., shown as VI 202 in FIG. 2, double E VI 400-a in FIG. 4A, etc.) to one of the at least one output terminal of the power supply unit.

At step 806, the method comprises coupling a load having a variable impedance at the at least one output terminal. In some cases, the load may comprise a plasma load.

At step 808, the method comprises receiving one or more of voltage and current feedback from the at least one output terminal.

At step 810, the method comprises controlling an effective inductance of the variable inductor such that at least a shape of an output waveform at the at least one output terminal remains constant or substantially constant when an impedance of the load changes. In some embodiments, the controlling is based at least in part on the receiving (i.e., step 808). Further, in some embodiments, the controlling comprises controlling a DC bias applied to at least one control arm of the variable inductor, as described in relation to the figures above.

Figure 9:
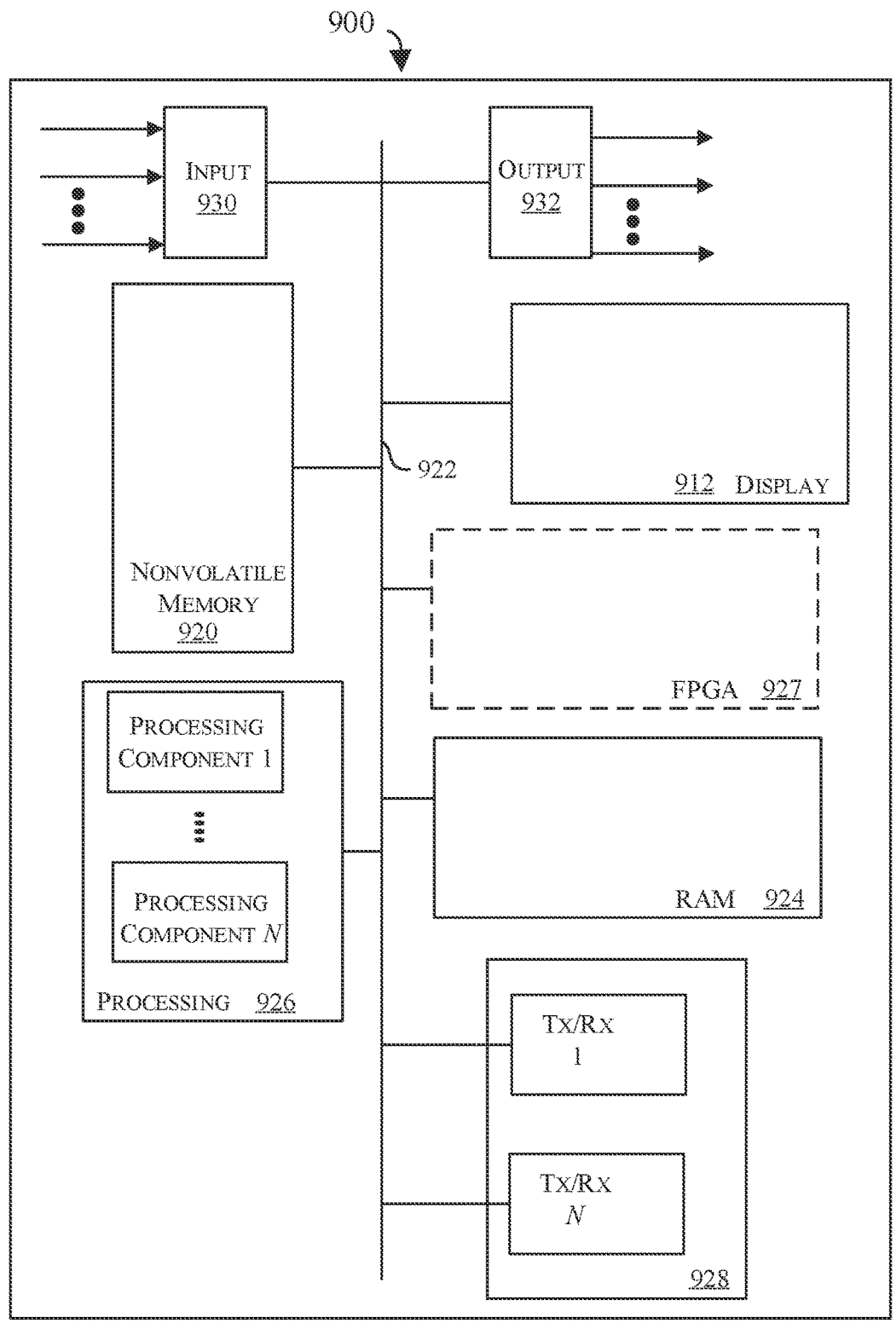
FIG. 9 illustrates a block diagram depicting physical components that may be utilized to realize one or more components of the power supply unit in FIG. 2, including at least the controller, according to an exemplary embodiment.

The methods described in connection with the embodiments disclosed herein may be embodied directly in hardware, in processor-executable code encoded in a non-transitory tangible processor readable storage medium, or in a combination of the two. Referring to FIG. 9 for example, shown is a block diagram depicting physical components that may be utilized to realize the controller (e.g., controller 206 in FIG. 2) according to an exemplary embodiment. As shown, in this embodiment a display portion 912 and nonvolatile memory 920 are coupled to a bus 922 that is also coupled to random access memory ("RAM") 924, a processing portion (which includes N processing components) 926, an optional field programmable gate array (FPGA) 927, and a transceiver component 928 that includes N transceivers. Although the components depicted in FIG. 9 represent physical components, FIG. 9 is not intended to be a detailed hardware diagram; thus many of the components depicted in FIG. 9 may be realized by common constructs or distributed among additional physical components. Moreover, it is contemplated that other existing and yet-to-be developed physical components and architectures may be utilized to implement the functional components described with reference to FIG. 9.

This display portion 912 generally operates to provide a user interface for a user, and in several implementations, the display is realized by a touchscreen display. In general, the nonvolatile memory 920 is non-transitory memory that functions to store (e.g., persistently store) data and processor-executable code (including executable code that is associated with effectuating the methods described herein). In some embodiments for example, the nonvolatile memory 920 includes bootloader code, operating system code, file system code, and non-transitory processor-executable code to facilitate the execution of a method described with reference to FIG. 8 described further herein.

In many implementations, the nonvolatile memory 920 is realized by flash memory (e.g., NAND or ONENAND memory), but it is contemplated that other memory types may be utilized as well. Although it may be possible to execute the code from the nonvolatile memory 920, the executable code in the nonvolatile memory is typically loaded into RAM 924 and executed by one or more of the N processing components in the processing portion 926.

The N processing components in connection with RAM 924 generally operate to execute the instructions stored in nonvolatile memory 920 to enable maintaining the shape and/or one or more characteristics of an output waveform supplied by a power supply unit, such as power supply unit 200 previously described in relation to FIG. 2. In some cases, the N processing components operate to execute the instructions stored in nonvolatile memory 920 to control an effective inductance of a variable inductor (e.g., variable inductor 202 in FIG. 2, variable inductors 400-a, 500-a, 600-a in FIGS. 4A, 5A, and 6A) such that at least a shape of an output waveform at an output terminal of a power supply remains constant or substantially constant when an impedance of a load, such as a plasma load, changes. For example, non-transitory, processor-executable code to effectuate the method described with reference to at least FIG. 8 may be persistently stored in nonvolatile memory 920 and executed by the N processing components in connection with RAM 924. As one of ordinarily skill in the art will appreciate, the processing portion 926 may include a video processor, digital signal processor (DSP), micro-controller, graphics processing unit (GPU), or other hardware processing components or combinations of hardware and software processing components (e.g., an FPGA or an FPGA including digital logic processing portions).

In addition, or in the alternative, the processing portion 926 may be configured to effectuate one or more aspects of the methodologies described herein (e.g., the method described with reference to FIG. 8). For example, non-transitory processor-readable instructions may be stored in the nonvolatile memory 920 or in RAM 924 and when executed on the processing portion 926, cause the processing portion 926 to adjust an effective inductance of a variable inductor, where the adjusting is based at least in part on determining a DC bias to be applied to a variable inductor, previously described in relation to FIGS. 2-7. Alternatively, non-transitory FPGA-configuration-instructions may be persistently stored in nonvolatile memory 920 and accessed by the processing portion 926 (e.g., during boot up) to configure the hardware-configurable portions of the processing portion 926 to effectuate the functions of the controller 206 and/or the DC current source 211.

The input component 930 operates to receive signals (e.g., current measurements C from current sensor 115-b, first and second voltage measurements A and B from first and second output terminals 130-a and 130-b, respectively) that are indicative of one or more aspects of the output waveform, such as a shape, rise time, fall time, etc. The signals received at the input component may include, for example, current or voltage at the output terminals. The output component generally operates to provide one or more analog or digital signals to effectuate an operational aspect of the waveform control. For example, the output portion 932 may provide the instructions to the DC current source 211 to adjust the DC current applied to a control winding of the variable inductor so as to maintain a shape of an output waveform.

The depicted transceiver component 928 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed:

1. A system for waveform control, comprising:
    a power supply having an input terminal and at least one output terminal, the at least one output terminal configured to be coupled to a load;
    a controller;
    a variable inductor configured to be coupled to one of the at least one output terminal of the power supply, the variable inductor comprising a first magnetic core, the first magnetic core comprising a plurality of arms, including at least a first inductor arm and a first control arm, wherein an inductance winding having one or more turns is wound around the first inductor arm, and wherein a first control winding comprising one or more turns is wound around the first control arm; and
    a DC current source configured to be coupled to the first control arm and the controller, and wherein the controller is configured to adjust a DC bias applied by the DC current source to the first control arm to control an output waveform at the at least one output terminal of the power supply;
    wherein the controller is configured to control the DC bias and thereby a shape of the output waveform based on one or more of voltage and current feedback from the power supply, and wherein controlling the DC bias based on the current feedback comprises maintaining a constant or substantially constant relationship between a peak to peak current value and a measured time for waves of the output waveform, wherein the measured time is selected from a group consisting of a rising time, a falling time, and a timespan between a first and a second pre-defined current level.

2. The system of claim 1, wherein the power supply produces a load-dependent output.

3. The system of claim 1, wherein the variable inductor is a double E variable inductor comprising the first control arm and a second control arm, and wherein a second control winding comprising one or more turns is wound around the second control arm.

4. The system of claim 3, wherein the first inductor arm comprises two sections separated by an air gap.

5. The system of claim 4, wherein the inductance winding generates a first AC magnetic flux component in the first inductor arm that flows through the first inductor arm and splits into a second AC magnetic flux component that flows through one of the two control arms, and a third AC magnetic flux component that flows through the other of the two control arms.

6. The system of claim 5, wherein the DC bias generates a DC magnetic flux component in each of the two control arms, and wherein each of the DC magnetic flux components substantially circulate through the two control arms in the same direction, and wherein the second and third AC magnetic flux components are equal in magnitude and flow in opposite directions.

7. The system of claim 6, wherein the DC magnetic flux components flowing through the two controls arms bias the AC magnetic flux component flowing through the first inductor arm.

8. The system of claim 1, wherein an effective inductance of the variable inductor is based at least in part on the DC bias.

9. The system of claim 1, wherein the at least one output terminal comprises two output terminals, and wherein the controller is configured to receive first and second voltage measurements from a first and a second output terminal, respectively, of the two output terminals.

10. The system of claim 9, wherein controlling the DC bias based on the voltage feedback comprises maintaining a constant or substantially constant relationship between a peak to peak value and a measured time for voltage differential waves associated with the output waveform, wherein the voltage differential waves are based at least in part on the first and second voltage measurements, and wherein the measured time is selected from a group consisting of a rising time, a falling time, and a timespan between a first and a second pre-defined voltage differential level.

11. The system of claim 1, wherein the variable inductor is a triple E variable inductor, and wherein the first magnetic core comprises an inductor core section having the first inductor arm and a control core section having the first control arm.

12. The system of claim 1, wherein the variable inductor is a quadruple U variable inductor, the quadruple U variable inductor further comprising:
    a second magnetic core having a second inductor arm, a second control arm, and another inductance winding having one or more turns wound around the second inductor arm;
    and wherein the first and the second magnetic core are separated by a spacer, and wherein the first control winding is wound around the spacer and the first and the second control arm.

13. The system of claim 1, wherein the DC bias generates a DC magnetic flux component in the first control arm; wherein the inductance winding is configured to receive a pulsed waveform, and wherein the DC magnetic flux component alters an inductance of the inductance winding.

14. A system for waveform control, comprising:
    a power supply having an input terminal and at least one output terminal, the at least one output terminal configured to be coupled to a load;
    a controller;
    a variable inductor configured to be coupled to one of the at least one output terminal of the power supply, the variable inductor comprising a first magnetic core, the first magnetic core comprising a plurality of arms, including at least a first inductor arm and a first control arm, wherein an inductance winding having one or more turns is wound around the first inductor arm, and wherein a first control winding comprising one or more turns is wound around the first control arm; and a DC current source configured to be coupled to the first control arm and the controller, and wherein the controller is configured to adjust a DC bias applied by the DC current source to the first control arm to control an output waveform at the at least one output terminal of the power supply;

wherein the variable inductor is a triple E variable inductor, and wherein the first magnetic core comprises an inductor core section having the first inductor arm and a control core section having the first control arm.

15. A system for waveform control, comprising:

a power supply having an input terminal and at least one output terminal, the at least one output terminal configured to be coupled to a load;

a controller;

a variable inductor configured to be coupled to one of the at least one output terminal of the power supply, the variable inductor comprising a first magnetic core, the first magnetic core comprising a plurality of arms, including at least a first inductor arm and a first control arm, wherein an inductance winding having one or more turns is wound around the first inductor arm, and wherein a first control winding comprising one or more turns is wound around the first control arm; and a DC current source configured to be coupled to the first control arm and the controller, and wherein the controller is configured to adjust a DC bias applied by the DC current source to the first control arm to control an output waveform at the at least one output terminal of the power supply;

wherein the variable inductor is a quadruple U variable inductor, the quadruple U variable inductor further comprising:

a second magnetic core having a second inductor arm, a second control arm, and another inductance winding having one or more turns wound around the second inductor arm;

and wherein the first and the second magnetic core are separated by a spacer, and wherein the first control winding is wound around the spacer and the first and the second control arm.

* * * * *